United States Patent
Kawasaki et al.

(10) Patent No.: US 6,475,887 B1
(45) Date of Patent: *Nov. 5, 2002

(54) METHOD OF MANUFACTURING SEMICONDUCTOR DEVICE

(75) Inventors: Youji Kawasaki; Taketo Takahashi; Takashi Murakami, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1136 days.

(21) Appl. No.: 08/615,337

(22) Filed: Mar. 11, 1996

Related U.S. Application Data

(60) Division of application No. 08/310,513, filed on Sep. 22, 1994, now Pat. No. 5,514,902, which is a continuation-in-part of application No. 08/218,965, filed on Mar. 28, 1994, now abandoned.

(30) Foreign Application Priority Data

| Sep. 16, 1993 | (JP) | 5-229394 |
| Jun. 30, 1994 | (JP) | 6-149476 |
| Aug. 25, 1994 | (JP) | 6-200957 |

(51) Int. Cl.[7] .................................. H01L 21/265
(52) U.S. Cl. .................................. 438/528; 438/527
(58) Field of Search .................... 437/24, 29, 150, 437/40, 20, 27

(56) References Cited

U.S. PATENT DOCUMENTS

| 4,683,645 A | * | 8/1987 | Naguib et al. ............... 437/24 |
| 4,722,913 A | | 2/1988 | Miller |
| 4,764,481 A | * | 8/1988 | Alvi et al. .................. 438/231 |
| 4,772,927 A | | 9/1988 | Saito et al. |

(List continued on next page.)

FOREIGN PATENT DOCUMENTS

| JP | 61-190681 | * | 9/1986 | .................. 437/24 |
| JP | 61-263274 | | 11/1986 | |
| JP | 1-309320 | | 12/1989 | |
| JP | 2-191375 | | 7/1990 | |
| JP | 2-270335 | | 11/1990 | |
| JP | 3-42872 | | 2/1991 | |
| JP | 3-44075 | | 2/1991 | |
| JP | 3-46238 | * | 2/1991 | .................. 437/24 |
| JP | 3-66165 | | 3/1991 | |
| JP | 3-13120 | * | 6/1991 | .................. 437/24 |
| JP | 4-157766 | | 5/1992 | |
| JP | 4-287332 | | 10/1992 | |
| JP | 5-67579 | | 3/1993 | |
| JP | 6-89870 | * | 3/1994 | .................. 437/24 |
| JP | 6-112158 | * | 4/1994 | .................. 437/24 |

OTHER PUBLICATIONS

"Optimization of the Germanium Preamorphization Conditions for Shallow–Junction Formation," Ozturk et al., IEEE Transaction on Electron Devices, vol. 35, No. 5, May 1988, pp. 659–668.

*Primary Examiner*—Savitri Mulpuri
(74) *Attorney, Agent, or Firm*—McDermott, Will & Emery

(57) ABSTRACT

A semiconductor device which can effectively prevent impurity diffusion in heat treatment for electrically activating the impurity, and a manufacturing method thereof are disclosed. In the semiconductor device, a diffusion preventing layer having a depth equal to or greater than a junction depth of source/drain regions is formed along the entire junction region of the source/drain regions. The diffusion preventing layer is formed near the surface at the side of a gate insulation layer of the gate electrode including impurity.

6 Claims, 28 Drawing Sheets

U.S. PATENT DOCUMENTS

| | | | |
|---|---|---|---|
| 5,030,580 A | * | 7/1991 | Furukawa et al. ............. 437/22 |
| 5,108,935 A | * | 4/1992 | Rodder ........................ 437/24 |
| 5,134,447 A | * | 7/1992 | Ng et al. ...................... 357/63 |
| 5,180,690 A | | 1/1993 | Czubatyj et al. |
| 5,223,445 A | * | 6/1993 | Fuse ........................... 437/24 |
| 5,245,208 A | * | 9/1993 | Eimori ....................... 257/344 |
| 5,247,198 A | | 9/1993 | Hamma et al. |
| 5,264,721 A | | 11/1993 | Gotow |
| 5,389,563 A | * | 2/1995 | Kuroi et al. |
| 5,393,676 A | * | 2/1995 | Anjum et al. .................. 437/24 |
| 5,453,385 A | * | 9/1995 | Shinji .......................... 437/11 |
| 5,527,724 A | * | 6/1996 | Brady et al. ................... 437/24 |
| 5,554,883 A | * | 9/1996 | Kuroi |
| 5,561,072 A | * | 10/1996 | Saito ........................... 437/24 |
| 5,585,286 A | * | 12/1996 | Arnowitz et al. .............. 437/24 |
| 5,633,177 A | * | 5/1997 | Antum ........................ 437/24 |
| 5,635,417 A | * | 6/1997 | Natsume ..................... 438/130 |
| 5,654,209 A | * | 8/1997 | Kato .......................... 438/528 |

\* cited by examiner

IMMEDIATELY AFTER IMPLANTATION

AFTER ANNEALING AT 800°C

IMMEDIATELY AFTER IMPLANTATION

AFTER ANNEALING AT 800°C

IMMEDIATELY AFTER IMPLANTATION

AFTER ANNEAL

US 6,475,887 B1

METHOD OF MANUFACTURING SEMICONDUCTOR DEVICE

This application is a division of application Ser. No. 08/310,513 filed Sep. 22, 1994 now U.S. Pat. No. 5,514,902, which is a continuation-in-part of application Ser. No. 08/218,965 filed Mar. 28, 1994, abandoned.

BACKGROUND OF THE INVENTION

1. Field of the Invention

The present invention relates generally to semiconductor devices and a method of manufacturing the same and, more particularly, to a semiconductor device having an MOS (Metal-Oxide-Semiconductor) transistor and a manufacturing method thereof.

2. Description of the Background Art

Conventionally, a semiconductor device including a P channel MOS transistor is known as one of semiconductor devices. FIG. 40 is a cross-sectional view showing a conventional semiconductor device including a P channel MOS transistor. Referring to FIG. 40, an isolation oxide film 102 is formed at a predetermined region on a main surface of an N type silicon substrate 101 for element isolation in the conventional semiconductor device. On an active region surrounded by isolation oxide film 102, P type source/drain regions 106a and 106b are formed spaced apart by a predetermined distance from each other to sandwich a channel region 110. On channel region 110, a gate electrode 104 is formed with a gate oxide film 103 posed therebetween. Sidewall oxide films 105 are formed at both sidewall portions of gate electrode 104.

A P channel MOS transistor is formed of P type source/drain regions 106a, 106b, gate oxide film 103 and gate electrode 104. Gate electrode 104 is formed of polycrystalline silicon including P type impurities such as boron (B) and has a thickness of about 2000 Å.

FIGS. 41–46 are cross-sectional views showing a method of manufacturing the conventional semiconductor device shown in FIG. 40. Referring to FIGS. 40–46, a process of manufacturing the conventional semiconductor device will be described.

At first, as shown in FIG. 41, an isolation oxide film 102 is formed using LOCOS (LOCal Oxidation of Silicon) method at a predetermined region on the main surface of N type silicon substrate 101. A silicon oxide film (not shown) and a non-doped polycrystalline silicon film (not shown) having a thickness of about 2000 Å are formed all over the surface and then patterned, so that a gate oxide film 103 formed of the silicon oxide film and a gate electrode 104 formed of the non-doped polycrystalline silicon film are formed.

Next, as shown in FIG. 42, a resist 111 is formed using photolithography to cover a region except for gate electrode 104. Boron is ion-implanted into gate electrode 104 using resist 111 as a mask. After that resist 111 is removed. Next as shown in FIG. 43, heat treatment at a temperature in the range of about 800° C. to 1000° C. is carried out for thirty minutes to activate impurities (boron) ion-implanted into gate electrode 104.

As shown in FIG. 44, after a silicon oxide film (not shown) is formed all over the surface, a sidewall oxide film 105 is formed at both sidewall portions of gate electrode 104 by anisotropic etching.

As shown in FIG. 45, a resist 112 is formed on gate electrode 104 using photolithography. After that, as shown in FIG. 46, P type impurities such as boron are ion-implanted into silicon substrate 101 using resist 112, sidewall oxide film 105 and isolation oxide film 102 as a mask. Thus, P type ion-implanted regions 107a and 107b are formed.

After that, resist 112 is removed. Then, boron introduced into ion-implanted regions 107a and 107b is electrically activated by heat treatment at a temperature of 800° C. for about thirty minutes. Thus, impurity diffusion regions (source/drain regions) 106a and 106b are formed as shown in FIG. 40. In this manner, a semiconductor device having a conventional P channel MOS transistor has been formed.

In the conventional semiconductor device described above, impurity is undesirably redistributed by the heat treatment in activating the impurity introduced into P type impurity implanted regions 107a and 107b shown in FIG. 46. More specifically, impurity introduced into P type impurity implanted regions 107a and 107b diffuses in all directions inside silicon substrate 101 by heat treatment. As a result, P type impurity diffusion regions (source/drain regions) 106a and 106b (see FIG. 40) which are larger than P type impurity implanted regions 107a and 107b are formed (see FIG. 46).

FIG. 47 is a cross-sectional view showing a problem of the conventional semiconductor device. Referring to FIG. 47, as the size of P type source/drain regions 106a and 106b becomes larger by impurity diffusion caused by heat treatment, channel length L is reduced. Thus, so called punch through phenomenon occurs in which current cannot be controlled by the gate voltage because a depletion layer in the vicinity of one of the source/drain regions 106a and 106b, for example, spreads to the other region thereof. This punch through phenomenon considerably appears when an element is miniaturized.

Another problem is that by heat treatment in activating P type impurity in a gate electrode 104, the P type impurity (boron) passes through a gate oxide film 103 to diffuse into a channel region 110. When the P type impurity in gate electrode 104 diffuses into channel region 110, there occurs a problem that threshold voltage the MOS transistor changes.

SUMMARY OF THE INVENTION

One object of the invention is to effectively prevent punch through phenomenon in a semiconductor device.

Another object is to effectively prevent the change of threshold voltage caused by diffusion of impurity in the gate electrode into the channel region in the semiconductor device.

Still another object is to effectively suppress the impurity diffusion caused by heat treatment in forming source/drain regions in a method of manufacturing a semiconductor device.

A further object of the invention is to effectively prevent the diffusion of impurities in the gate electrode into the channel region caused by heat treatment for activation thereof in the method of manufacturing the semiconductor device.

According to the first aspect of the present invention, a semiconductor device includes a semiconductor region of a first conductivity type having a main surface, a pair of source/drain regions of a second conductivity type having a predetermined junction depth formed spaced apart by a predetermined distance from each other to sandwich a channel region on the main surface of the semiconductor region, an implanted layer having depth equal to or greater than the junction depth of the source/drain regions, formed along the entire junction region of the source/drain regions and including a material selected from the group consisting of nitrogen, fluorine, argon, oxygen and carbon, and a gate electrode formed on the channel region with a gate insulation layer posed therebetween. Preferably, the implanted layer described above is formed to have depth greater than the junction depth of the source/drain regions and to cover the source/drain regions.

In the semiconductor device, since the implanted layer having the depth equal to or greater than the junction depth of the source/drain regions is formed along the entire junction region of the source/drain regions, impurity diffusion caused by heat treatment in forming the source/drain regions can be effectively prevented. Thus, unlike the conventional device, reduction of the channel length caused by the impurity diffusion is prevented, effectively reducing the punch through phenomenon. Note that if the implanted layer described above is formed to have the depth greater than the junction depth of source/drain regions and to cover the source/drain regions, the impurity diffusions caused by heat treatment in the formation of the source/drain regions is suppressed more effectively.

According to another aspect of the present invention, a semiconductor device includes a semiconductor region of a first conductivity type having a main surface, a pair of source/drain regions of a second conductivity type formed with a predetermined distance therebetween to sandwich a channel region on the main surface of the semiconductor device, and a gate electrode formed on the channel region with a gate insulation layer posed therebetween. The gate electrode includes impurity and an implanted layer including a material selected from the group consisting of nitrogen, fluorine, argon, oxygen and carbon near the surface at the side of the gate insulation layer.

In the semiconductor device, since the implanted layer is formed near the surface at the side of the gate insulation layer of the gate electrode including impurity, the impurity in the gate electrode is effectively prevented from passing through the gate insulation layer and diffusing into the channel region caused by heat treatment in activating the impurity in the gate electrode. Thus, change of the threshold voltage caused by the diffusion of the. impurity into the channel region is prevented.

According to still another aspect of the present invention, a method of manufacturing a semiconductor device includes the steps of forming a gate electrode at a predetermined region on the main surface of a semiconductor region of a first conductivity type with a gate insulation film posed therebetween, forming an implanted layer by ion-implanting a material selected from the group consisting of nitrogen, fluorine, argon, oxygen and carbon into the semiconductor region using the gate electrode as a mask with a first projected range, forming a pair of impurity regions of a second conductivity type by ion-implanting an impurity of a second conductivity type into the semiconductor region using the gate electrode as a mask with a second projected range which is smaller than the first projected range and effecting heat treatment.

In the method of manufacturing the semiconductor device, the implanted layer is formed by ion-implanting with a first projected range a material selected from the group consisting of nitrogen, fluorine, argon, oxygen and carbon into the semiconductor region of a first conductivity type, a pair of impurity regions of a first conductivity type are formed by ion-implanting impurity of a second conductivity type into the semiconductor region with a second projected range which is smaller than the first projected range, and then heat treatment is carried out, therefore diffusion of impurity in the impurity region is effectively suppressed by the implanted layer described above in heat treatment. Thus, unlike the prior art, reduction of channel length is prevented and as a result, punch through phenomenon is reduced effectively.

According to still another aspect of the present invention, a method of manufacturing a semiconductor device includes the steps of forming a gate electrode at a predetermined region on the main surface of a semiconductor region of a first conductivity type with a gate insulation layer posed therebetween, forming an impurity region having a predetermined depth from the upper surface of the gate electrode in the gate electrode by introducing impurity into the gate electrode, forming an implanted layer having a depth equal to or greater than that of the impurity region described above by ion-implanting a material selected from the group consisting of nitrogen, fluorine, argon, oxygen and carbon into the gate electrode and after that carrying out heat treatment.

In a method of manufacturing the semiconductor device, by ion-implanting a material selected from the group consisting of nitrogen, fluorine, argon, oxygen and carbon into a gate electrode including an impurity region having a predetermined depth, an implanted layer having a depth equal to or greater than that of the impurity region is formed and then heat treatment is carried out, therefore impurity in the impurity region is prevented from diffusing into the side of the gate insulation layer and from invading the channel region, owing to the implanted layer. Therefore, change of the threshold voltage is prevented. In the method of manufacturing the semiconductor device in accordance with the above aspects of the present invention, when nitrogen molecular ions ($N_2^+$) are used in introducing nitrogen, impurity diffusion can be suppressed as compared with the case when simple ions ($N^+$) of nitrogen are used. More specifically, molecular ions ($N_2^+$) of nitrogen has twice the number of nitrogen elements and twice the mass number of the simple ion ($N^+$) of nitrogen. Therefore, disorder in crystal property comes to be more likely in the region where molecular ions ($N_2^+$) of nitrogen are introduced. Accordingly, channeling phenomenon at the time of impurity ion implantation can be further suppressed, and diffusion of impurity during heat treatment can further be suppressed.

In a bipolar transistor in accordance with still another aspect of the present invention, the p type epitaxial growth layer includes boron and nitrogen. Therefore, diffusion of boron can be effectively prevented by nitrogen.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the-present invention will be described in the following with reference to the figures.

Figure 1:
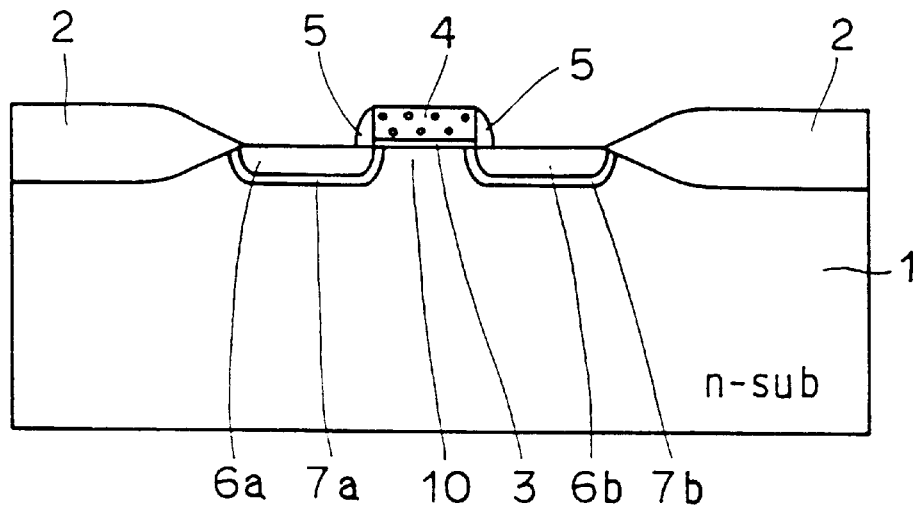
FIG. 1 is a cross-sectional view showing a semiconductor device including a P channel MOS transistor according to a first embodiment of the present invention.

FIG. 1 is a cross-sectional view showing a semiconductor device including a P channel MOS transistor according to a first embodiment of the present invention.

Referring to FIG. 1, in the semiconductor device according to the first embodiment, an insulation oxide film 2 is formed at a predetermined region on the main surface of an N type silicon substrate 1. Source/drain regions 6a and 6b are formed with a predetermined distance therebetween to sandwich a channel region 10 on the main surface of silicon substrate 1 surrounded by insulation oxide film 2. A gate electrode 4 formed of a polycrystalline silicon film including impurity is formed on a channel region 10 with a gate oxide film 3 having the thickness of 500–2000 Å posed therebetween. Sidewall oxide films 5 are formed at both sidewall portions of gate electrode 4.

Figure 41:
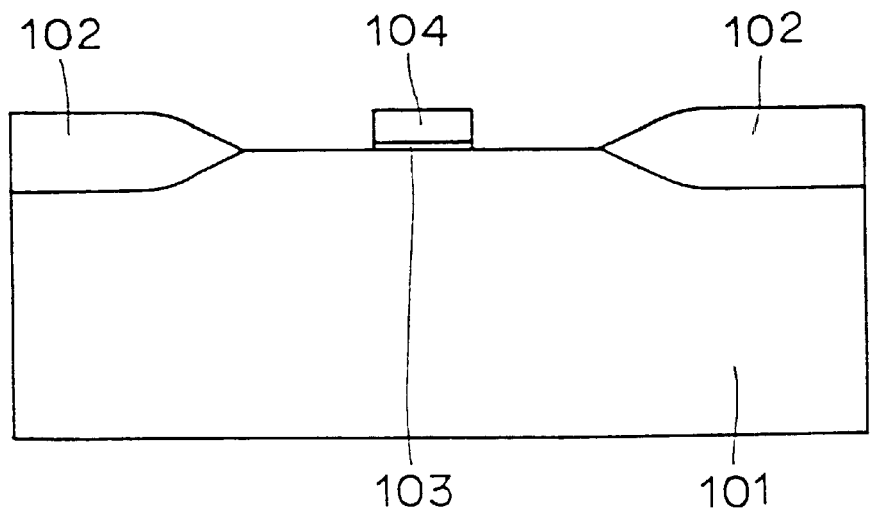
FIGS. 41 through 46 are cross-sectional views showing the first to sixth steps of manufacturing the conventional semiconductor device shown in FIG. 40.
Figure 42:
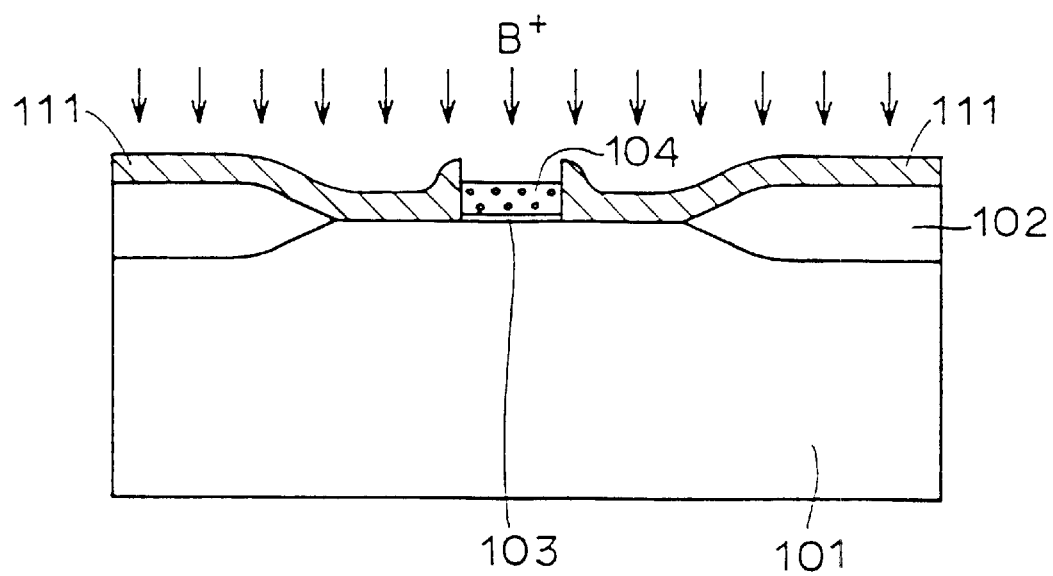
Figure 43:
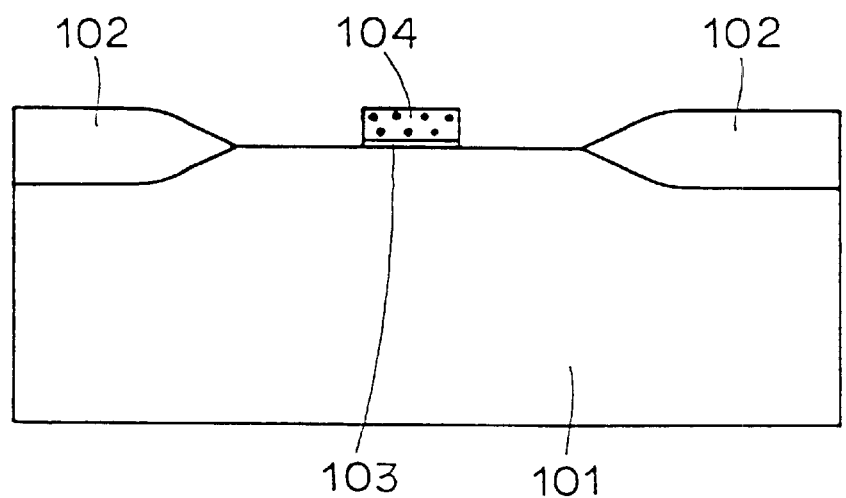
Figure 44:
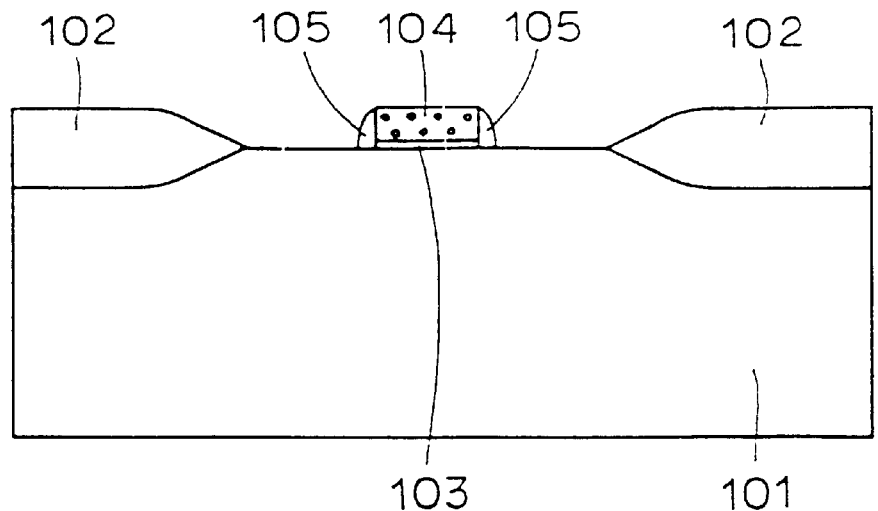
Figure 45:
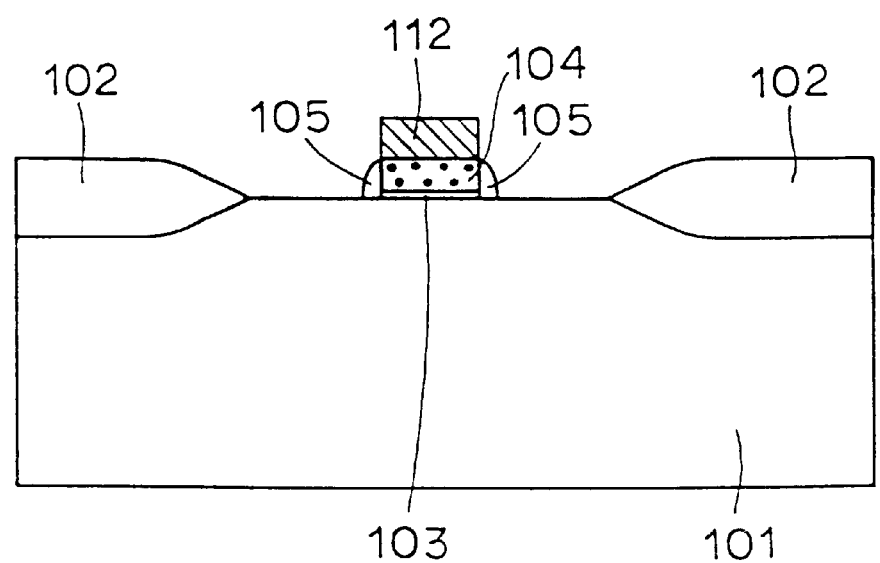
Figure 46:
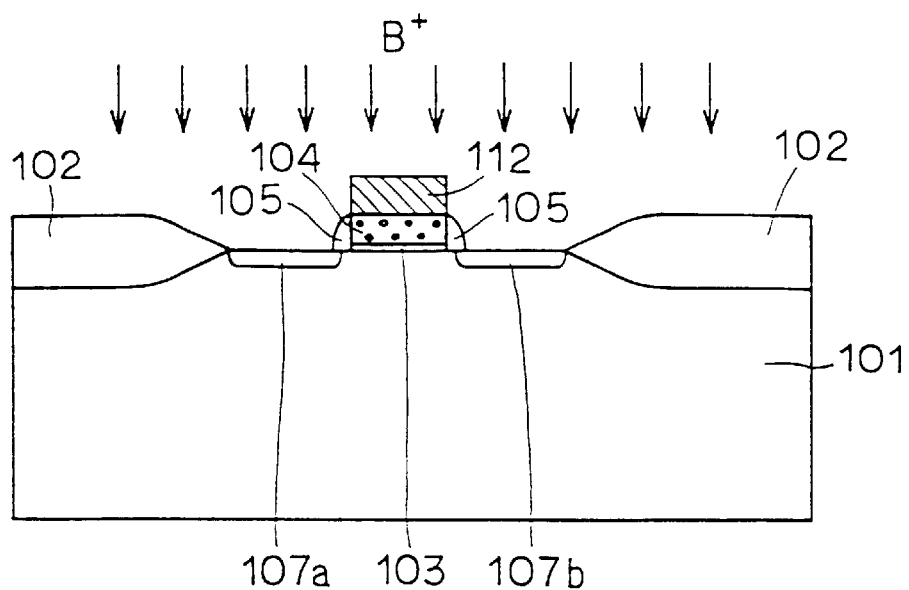
Figure 47:
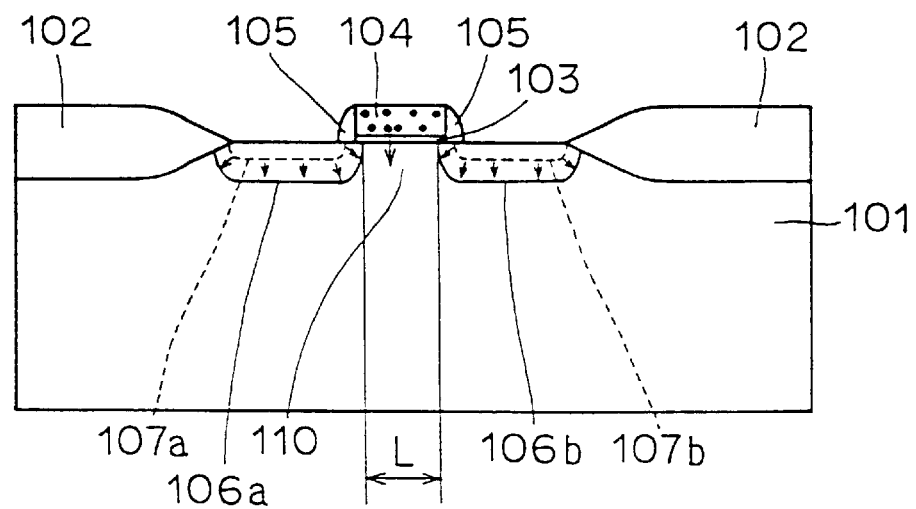
FIG. 47 is a cross-sectional view showing the problem of the conventional semiconductor device.

In the first embodiment, nitrogen implanted regions 7a and 7b are formed respectively to cover a junction region of source/drain regions 6a and 6b. Owning to these nitrogen implanted regions 7a and 7b, impurity diffusion in vertical and parallel directions to the main surface of silicon substrate 1 is effectively prevented during the step of heat treatment in the formation of source/drain regions 6a and 6b. Thus, channel length will not be reduced by the diffusion of impurity in the parallel direction as has been often the case with the conventional semiconductor device such as shown in FIG. 41. As a result, punch through phenomenon is effectively prevented.

FIGS. 2–8 are cross-sectional views showing a process for manufacturing the semiconductor device according to the first embodiment shown in FIG. 1. Referring to FIGS. 1–8, the process for manufacturing the semiconductor device according to the first embodiment will be described.

Figure 2:
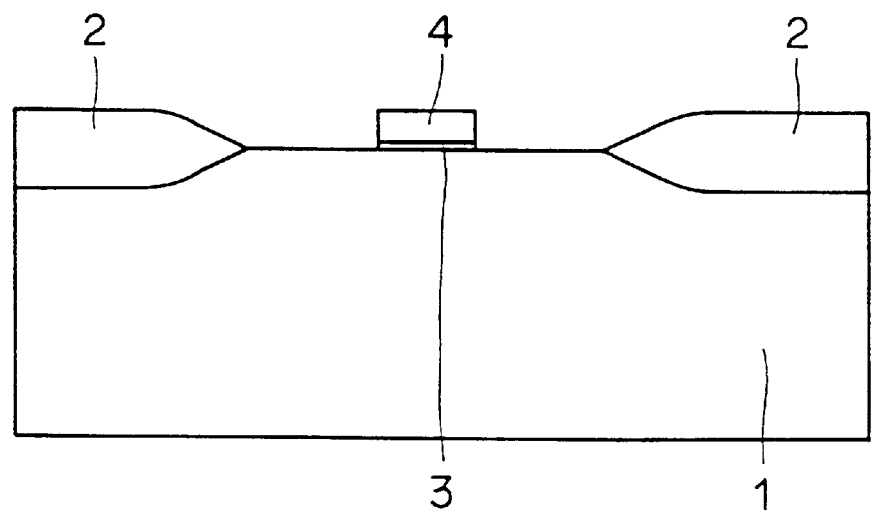
FIGS. 2 through 9 are cross-sectional views showing the first to eighth steps of manufacturing the semiconductor device of the first embodiment shown in FIG. 1.

As shown in FIG. 2, an insulation oxide film 2 is formed at a predetermined region on the main surface of N type silicon substrate 1 by using LOCOS method. A silicon oxide film (not shown) and a non-doped polycrystalline silicon film (not shown) having the thickness of about 2000 Å are formed and patterned, and thus a gate oxide film 3 formed of the silicon oxide film and a gate electrode 4 formed of the non-doped polycrystalline silicon film are formed.

Figure 3:
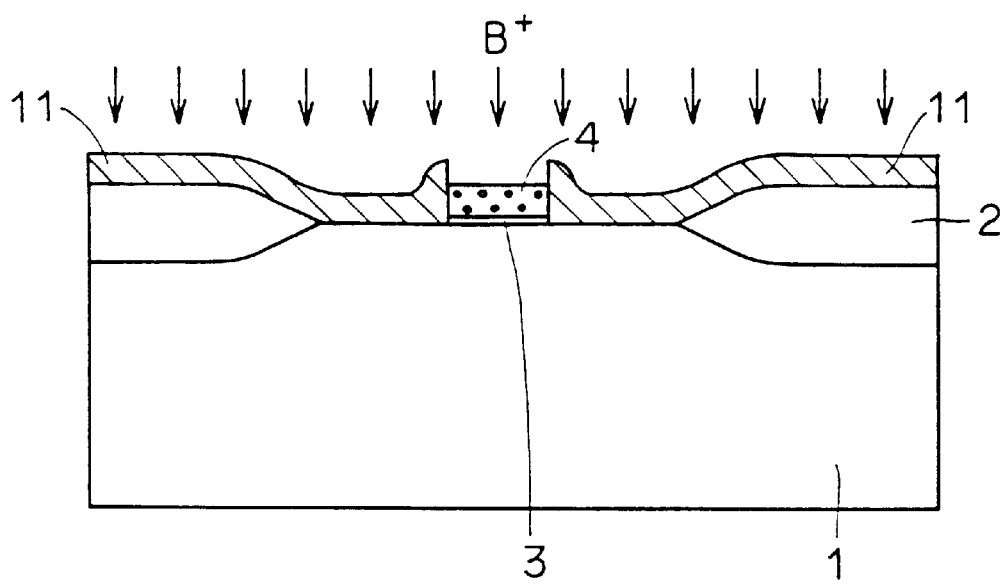
Figure 4:
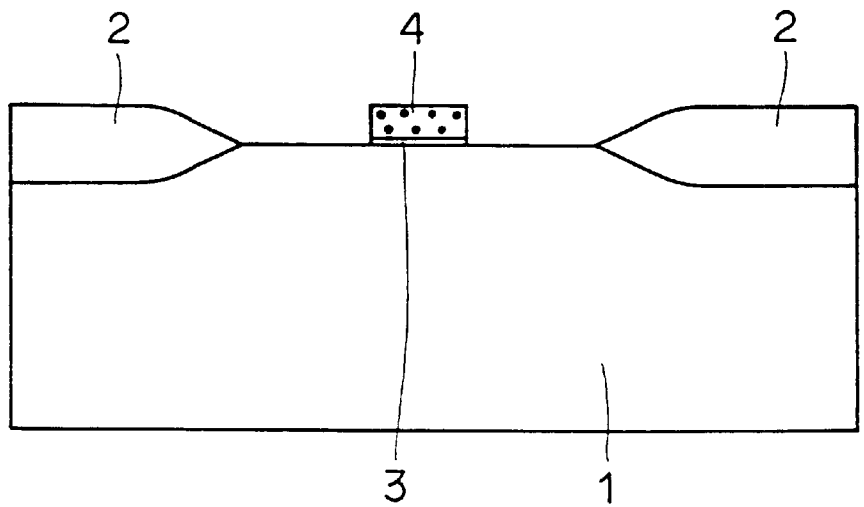

Next, as shown in FIG. 3, a resist 11 is formed using photolithography to cover the region except for gate electrode 4. Using resist 11 as a mask, boron (B) is ion-implanted to gate electrode 4. After that, resist 11 is removed. Then, as shown in FIG. 4, heat treatment at a temperature of about 800 to 900° C. is carried out for thirty minutes to activate impurity (boron) implanted into gate electrode 4.

Figure 5:
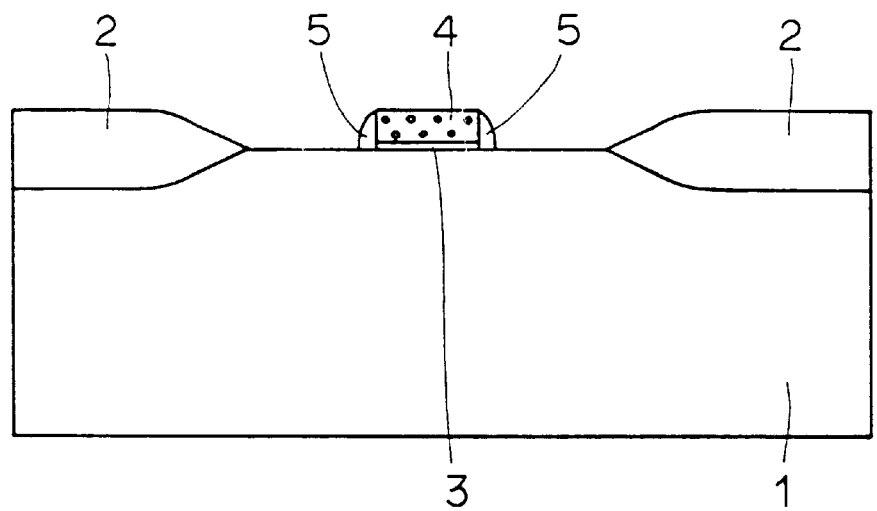

Then, after a silicon oxide film (not shown) is formed on the entire surface, sidewall oxide films 5 are formed by anisotropic etching at both sidewall portions of gate electrode 4 as shown in FIG. 5.

Figure 6:
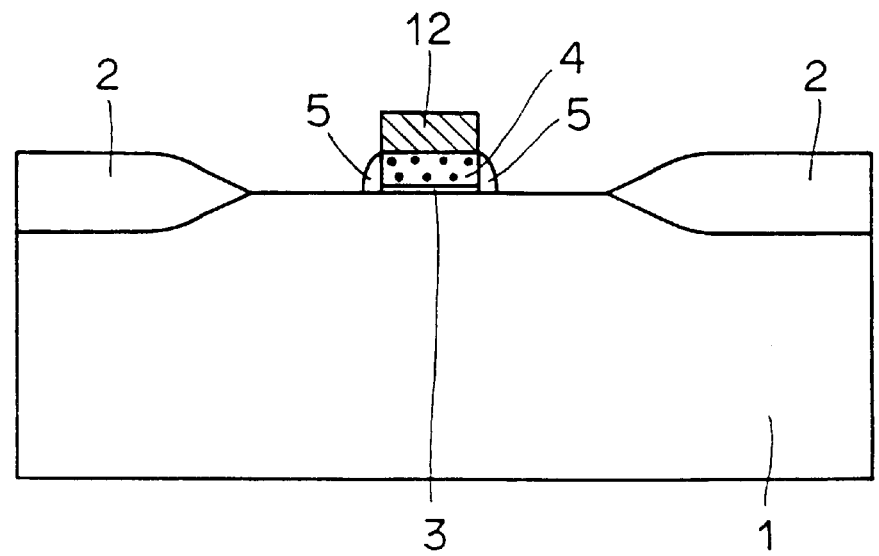
Figure 7:
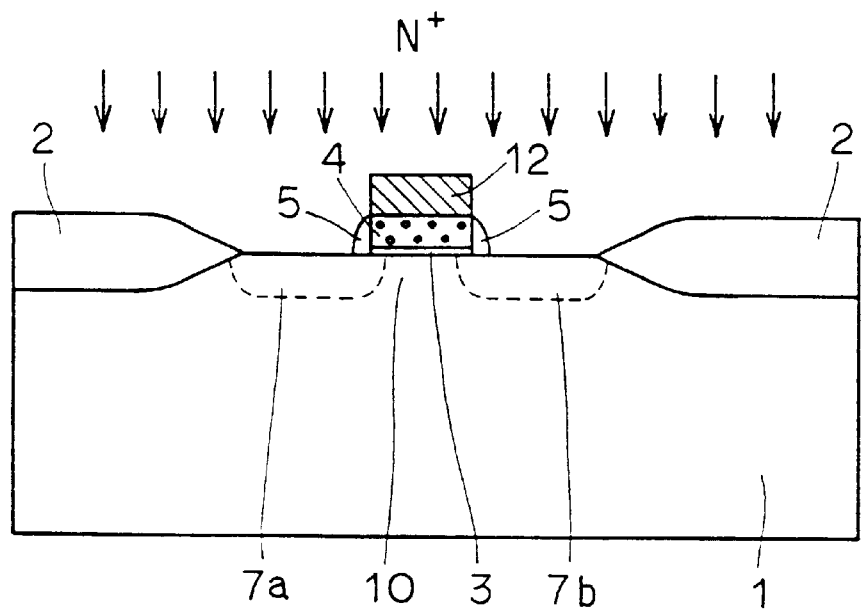

As shown in FIG. 6, a resist 12 is formed on gate electrode 4 using photolithography. Then, as shown in FIG. 7, nitrogen is ion-implanted into silicon substrate 1 using resist 12, sidewall oxide film 5 and isolation oxide film 2 as a mask. The ion-implantation conditions are set as follows: impurity concentration is 1E15–1E16/cm$^2$, implantation energy has a value (=0.065 μm at 30 KeV) larger than that (=0.032 μm at 10 KeV) of the projected range of boron which will be implanted in a subsequent process. By implanting ion under such implantation condition, nitrogen implanted regions 7a and 7b are formed. Note that the ion-implantation for forming the nitrogen implanted regions 7a and 7b may be carried out before the formation of sidewall oxide film 5.

Figure 8:
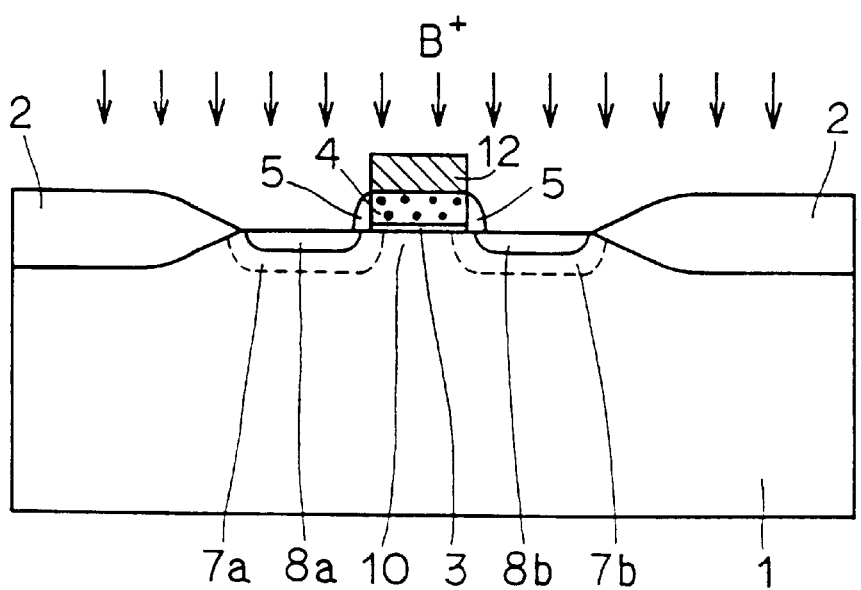

As shown in FIG. 8, boron is ion-implanted into silicon substrate 1 using sidewall oxide film 5 and isolation oxide film 2 as a mask. The ion-implantation is carried out under the condition in which the projected range is 0.032 μm at 10 KeV and impurity concentration is $5E15/cm^2$. Thus, impurity implanted regions 8a and 8b are formed. The impurity implanted regions 8a and 8b are surrounded by nitrogen implanted regions 7a and 7b. Then, the resist is removed.

Figure 9:
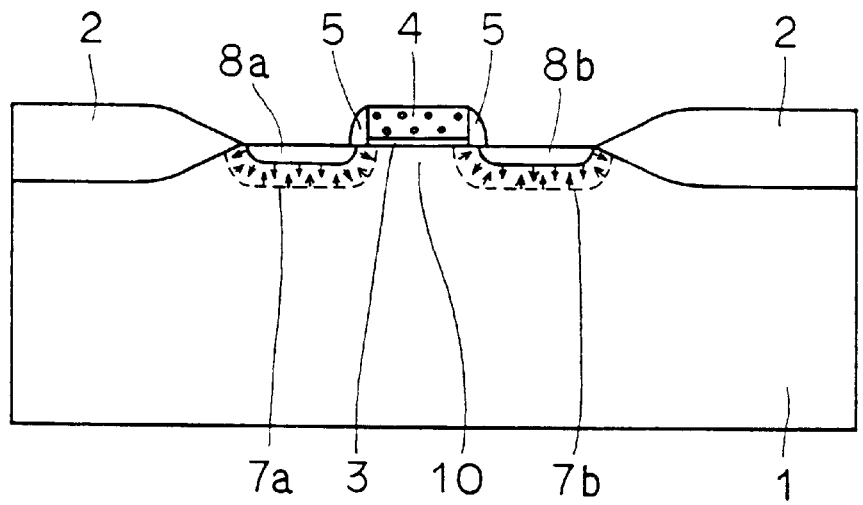

As shown in FIG. 9, heat treatment is carried out at a temperature of 800° C. for thirty minutes in the atmosphere of nitrogen by using furnace-annealing for electrically activating boron in impurity implanted regions 8a and 8b. By this heat treatment, boron in impurity implanted regions 8a and 8b diffuses inwardly to silicon substrate 1, while nitrogen in nitrogen implanted region 7a diffuses towards the surface of silicon substrate 1. The diffusion of nitrogen toward the surface of silicon substrate 1 suppresses the inward diffusion of boron to silicon substrate 1. More specifically, inward diffusion of boron to silicon substrate 1 can be suppressed by interdiffusion of nitrogen and boron. Thus, boron diffusion in the direction along the main surface of silicon substrate 1 is suppressed, which effectively prevents the conventional problem of reduction of channel length. As a result, punch through phenomenon can be reduced.

Figure 10:
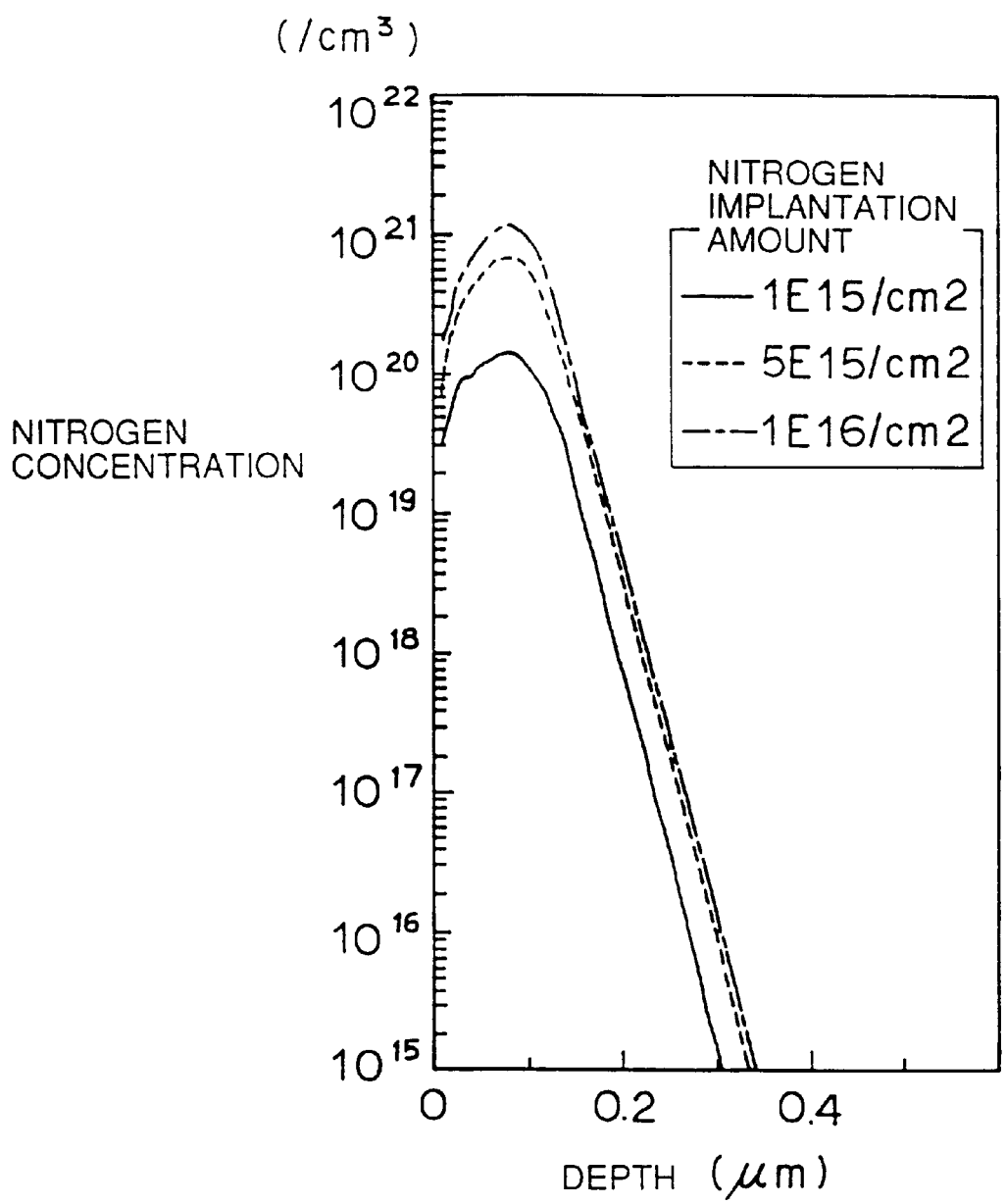
FIG. 10 is a graph showing the relation between the diffusion depth immediately after implantation and nitrogen concentration in the nitrogen implantation step shown in FIG. 7.
Figure 11:
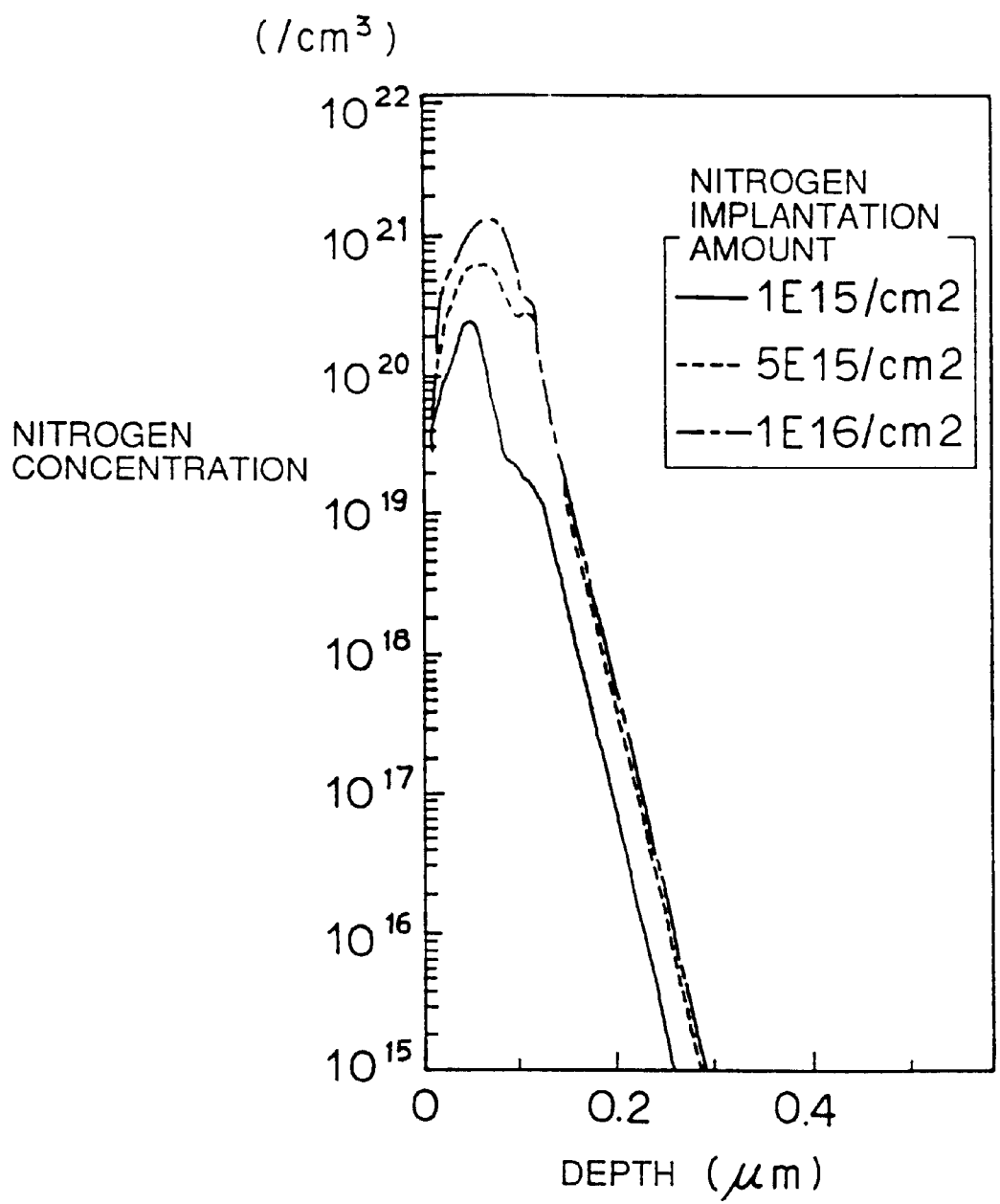
FIG. 11 is a graph showing the relation between the depth after annealing at a temperature of 800° C. and nitrogen concentration in the step of annealing (heat treatment) shown in FIG. 9.
Figure 12:
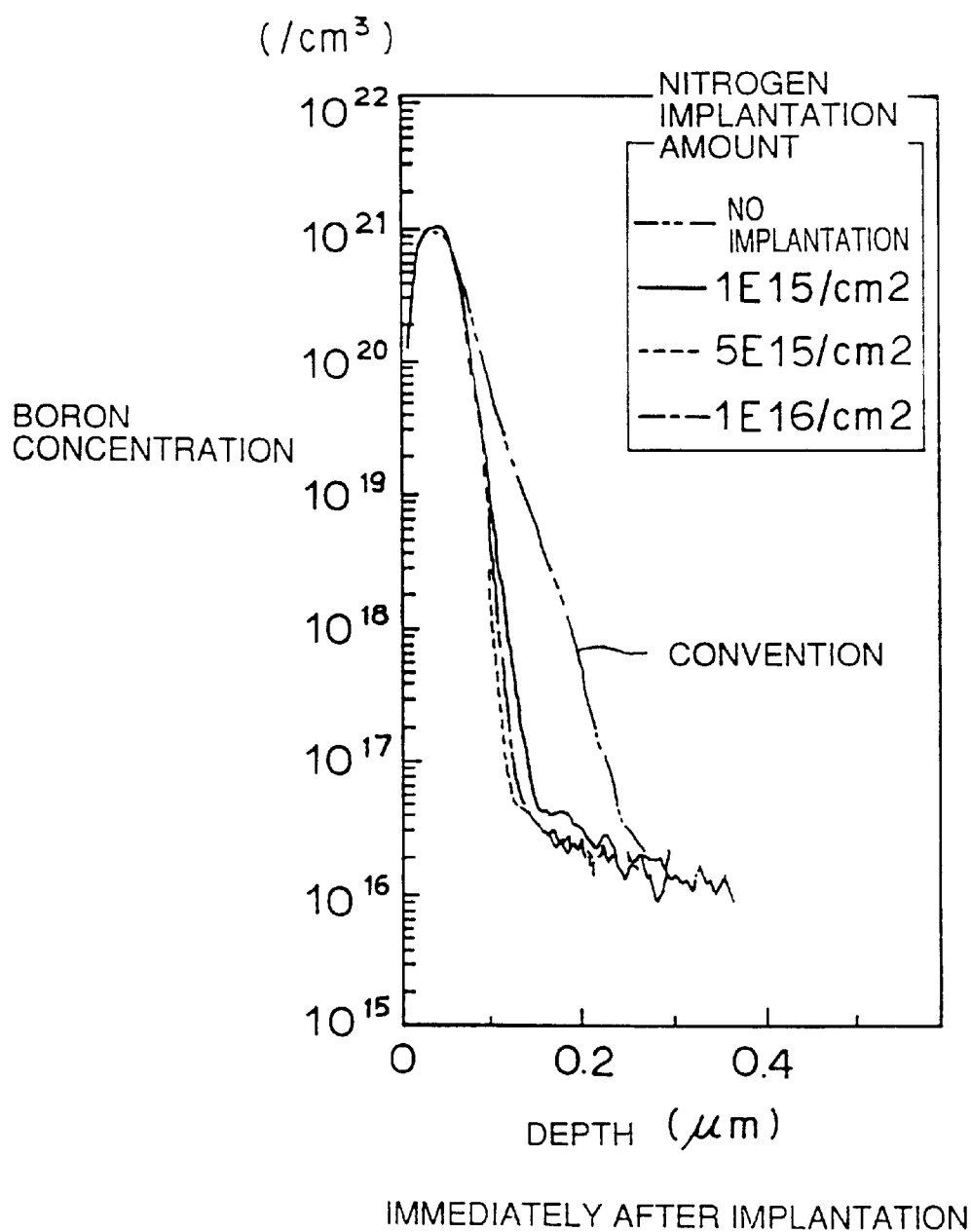
FIG. 12 is a graph showing the relation between the depth immediately after the implantation and boron concentration in the step of boron-implantation shown in FIG. 8.
Figure 13:
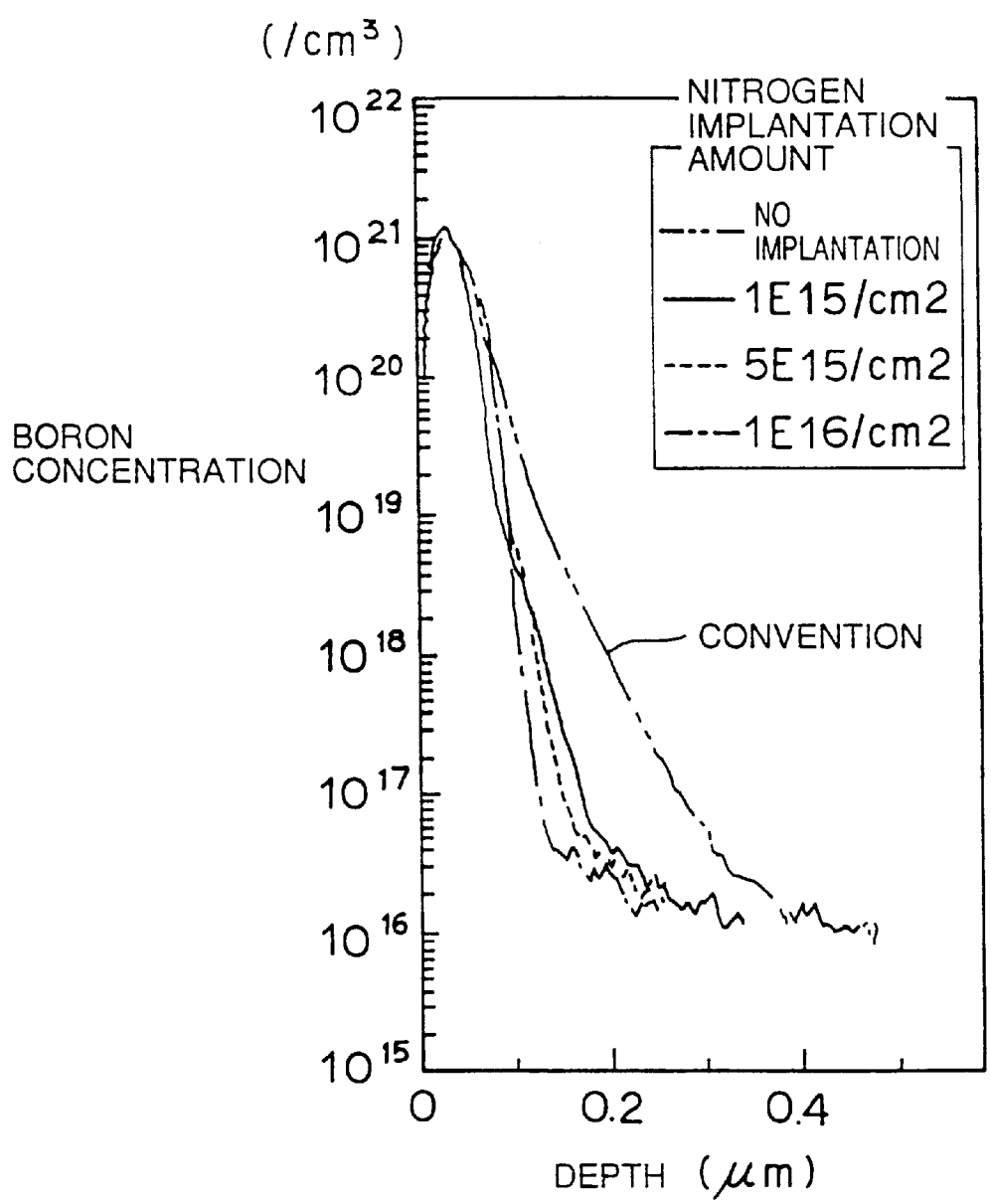
FIG. 13 is a graph showing the relation between the depth after annealing at a temperature of 800° C. and boron concentration in the step of annealing (heat treatment) shown in FIG. 9 in comparison with the prior art.

FIG. 10 is a graph showing the relation between nitrogen concentration immediately after nitrogen ion-implantation and the depth from the surface of the substrate and FIG. 11 is a graph showing the relation between nitrogen concentration after annealing at a temperature of 800° C. and the depth from the surface of the substrate. FIG. 12 is a graph showing the relation between boron concentration immediately after boron ion-implantation and the depth from the surface of the substrate in comparison with the conventional one and FIG. 13 is a graph showing the relation between boron concentration after annealing at a temperature of 800° C. and the depth from the surface of the substrate in comparison with a conventional one.

Referring to FIGS. 10 and 11, when the nitrogen implantation amount is set to $1E15/cm^2$, or $1E16/cm^2$, it is found that after annealing at a temperature of 800° C., the diffusion depth from the surface of the substrate in the portion having low nitrogen concentration comes to be smaller than that immediately after the implantation. More specifically, nitrogen diffuses towards the surface of the substrate by annealing. As for boron concentration, as shown in FIGS. 12 and 13, when the conventional nitrogen implantation has not been carried out, it is found that the diffusion depth comes to be considerably greater after annealing in comparison with that immediately after implantation. Meanwhile, when nitrogen implantation has been carried out, distribution of boron concentrations immediately after implantation and after annealing are scarcely changed and redistribution is not observed. More specifically, by carrying out nitrogen implantation, boron diffusion inwardly to the substrate caused by heat treatment can be suppressed. As is obvious from FIGS. 10 and 12, nitrogen should be implanted deeper than boron in the process of ion-implantation.

As described above, by forming deep nitrogen implanted regions 7a and 7b, forming shallower impurity implanted regions 8a and 8b (see FIG. 8) than that of nitrogen implanted regions and then carrying out heat treatment, inward impurity diffusion to the substrate is suppressed. Thus, source/drain regions 6a and 6b with reduced expansion as shown in FIG. 1 can be formed.

Figure 14:
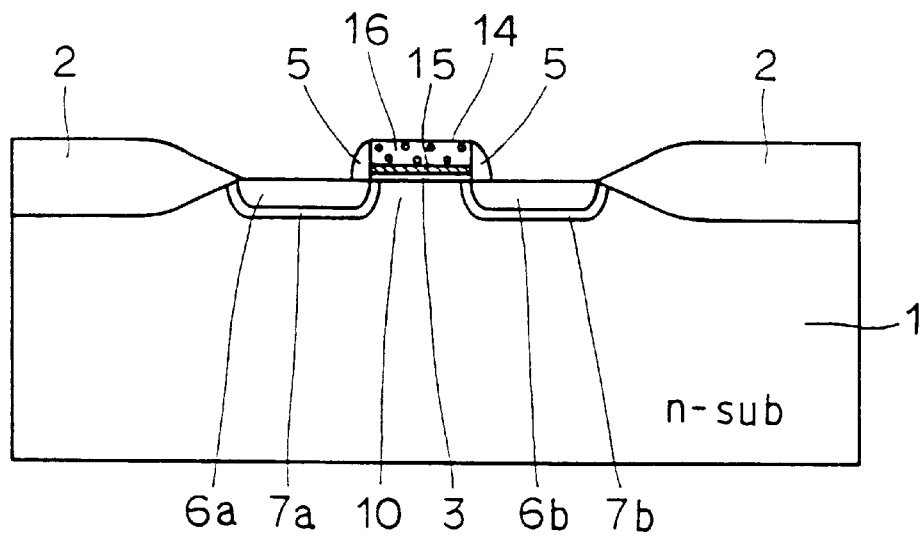
FIG. 14 is a cross-sectional view showing a semiconductor device including a P channel MOS transistor according to a second embodiment of the present invention.

FIG. 14 is a cross-sectional view showing a semiconductor device including a P channel MOS transistor according to a second embodiment of the present invention. Referring to FIG. 14, in the second embodiment, nitrogen implanted regions 7a and 7b are formed to cover source/drain regions 6a and 6b in the same manner as that of the first embodiment described above. The second embodiment is different from the first embodiment in that nitrogen implanted region 15 is formed at the surface on the side of gate oxide film 3 of gate electrode 14. Boron implanted region 16 is formed on nitrogen implanted region 15 in gate electrode 14.

Nitrogen implanted region 15 can effectively prevent boron from passing through gate oxide film 3 to diffuse into channel region 10. Thus, change of threshold voltage caused by the impurity diffusion into channel region 10 can be effectively prevented.

FIGS. 15–18 are cross-sectional views showing a process for manufacturing the gate electrode portion in the semiconductor device according to the second embodiment shown in FIG. 14. Referring to FIGS. 15–18, the process for manufacturing the semiconductor device according to the second embodiment will be described.

Figure 15:
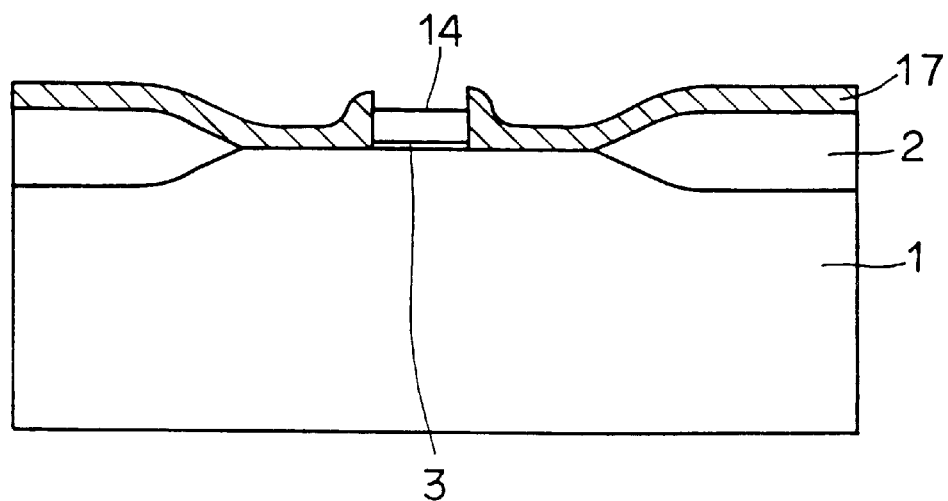
FIGS. 15 through 18 are cross-sectional views showing the first to fourth steps of manufacturing the semiconductor device according to the second embodiment shown in FIG. 14.

As shown in FIG. 15, an insulation oxide film 2 is formed at a predetermined region on the main surface of a silicon substrate 1 by using LOCOS method. A silicon oxide film (not shown) having a thickness of about 500 to about 2000 Å and a non-doped polycrystalline silicon (not shown) having a thickness of about 2000 Å are formed to cover the entire surface, and then by patterning the same, a gate oxide film 3 formed of the silicon oxide film and a gate electrode 14 formed of the non-doped polycrystalline silicon film are formed. A resist 17 is formed using photolithography to cover the portions except for gate electrode 14.

Figure 16:
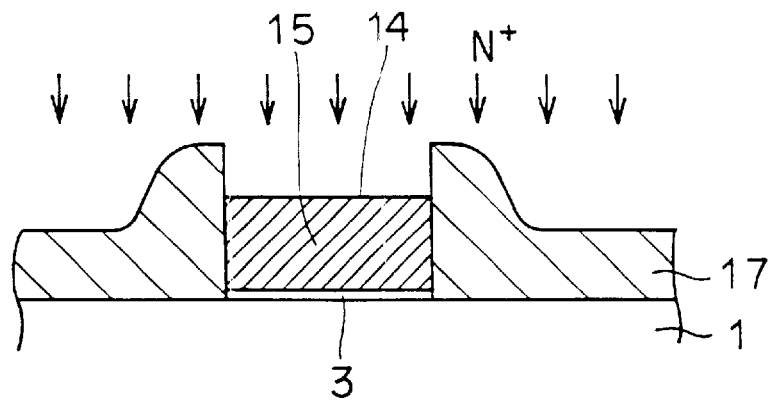

As shown in FIG. 16, nitrogen is ion-implanted into gate electrode 14 using resist 17 as a mask. The nitrogen ion-implantation is carried out under the condition as follows: the concentration is $1E15–1E16/cm^2$ and implantation energy is high enough (e.g. 90 keV) to have nitrogen ions implanted near the surface on the side of gate oxide film 3 of gate electrode 14. Thus, ion-implanted region 15 is formed.

Figure 17:
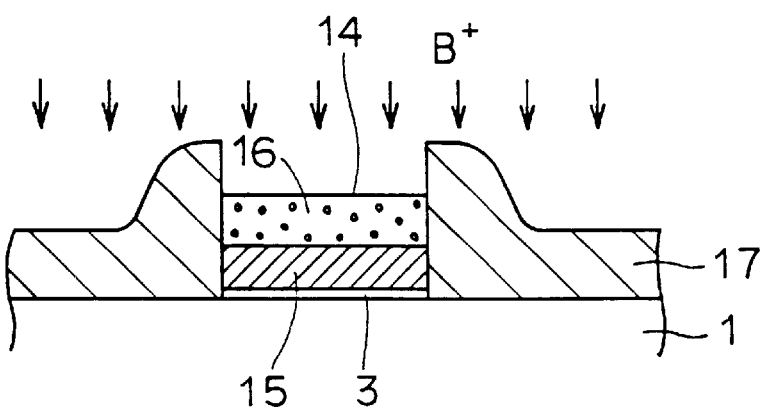

Referring to FIG. 17, boron is ion-implanted into gate electrode 14 using resist 17 as a mask, at a concentration of $5E15/cm^2$ and at an implantation energy (e.g. 30 keV) low enough to have the depth thereof (of boron) smaller than that of nitrogen implanted region 15. Thus, a boron implanted region 16 is formed. Then, resist 17 is removed.

Figure 18:
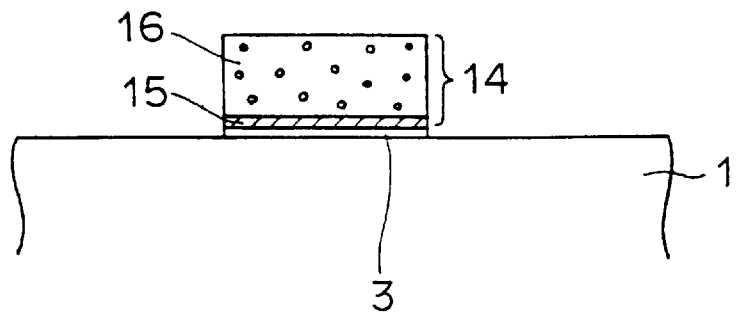

In order to electrically activate boron in boron implanted region 16, heat treatment using furnace-annealing at a temperature about 800° C. to about 1000° C. is carried out. By this heat treatment, boron in boron implanted region 16 diffuses towards gate oxide film 3 and nitrogen in nitrogen implanted region 15 diffuses upwardly. Boron diffusion towards gate oxide film 3 can be suppressed in comparison with the prior art by interdiffusion of boron and nitrogen. Then, finally such as structure is provided as shown in FIG. 18, in which nitrogen implanted region 15 is posed between boron implanted region 16 and gate oxide film 3.

Figure 19:
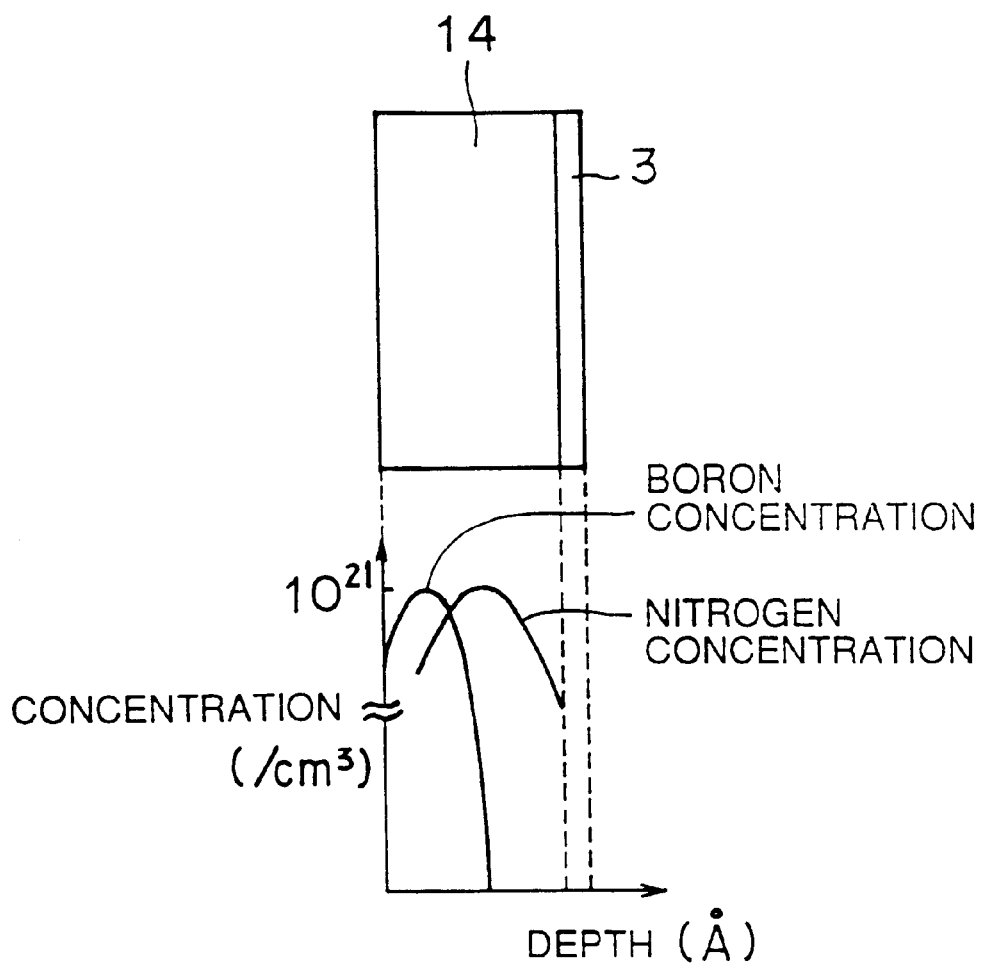
FIG. 19 is a graph showing the relation between the depth of diffusion of nitrogen and boron from the surface of the gate electrode after annealing and boron and nitrogen concentrations in the step of implantation of nitrogen and boron shown in FIGS. 16 and 17.
Figure 20:
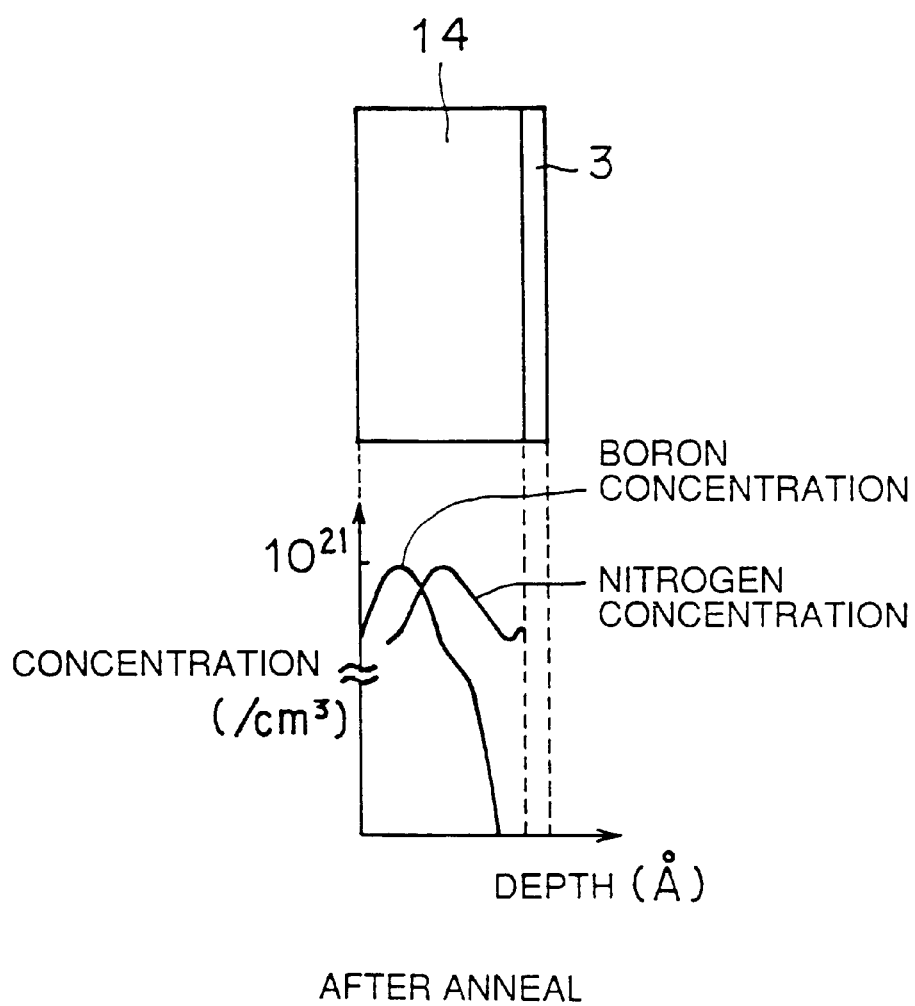
FIG. 20 is a graph showing the relation between the depth of diffusion of nitrogen and boron from the surface of the gate electrode and boron and nitrogen concentrations in the steps of annealing (heat treatment) shown in FIG. 18.

FIG. 19 is a graph showing the relation between the depth from the surface of the gate electrode immediately after ion-implantation and boron and nitrogen concentrations, and FIG. 20 is a graph showing the relation between the depth from the surface of the gate electrode after annealing (heat treatment) and boron and nitrogen concentrations. Referring to FIGS. 19 and 20, as for boron concentration distribution, after annealing low concentration portion is shifted to the side of gate oxide film 3 as compared with a distribution immediately after the implantation. In contrast, as for nitrogen concentration distribution, after annealing high concentration portion is shifted to the opposite side of gate oxide film 3 as compared with the distribution immediately after the implantation. This implies the interdiffusion of boron and nitrogen. The interdiffusion of boron and nitrogen suppresses boron diffusion towards gate oxide film 3. As shown in FIG. 20, nitrogen only exists near gate oxide film 3 after annealing. This can be represented by a cross-sectional configuration such as shown in FIG. 18.

As described above, after forming gate electrode 14 including impurities, sidewall oxide film 5, source/drain regions 6a and 6b, nitrogen implanted regions 7a and 7b are formed as shown in FIG. 14 by using manufacturing process which is the same as that of the first embodiment shown in FIGS. 5–9. Thus, the semiconductor device according to the second embodiment is completed.

Figure 21:
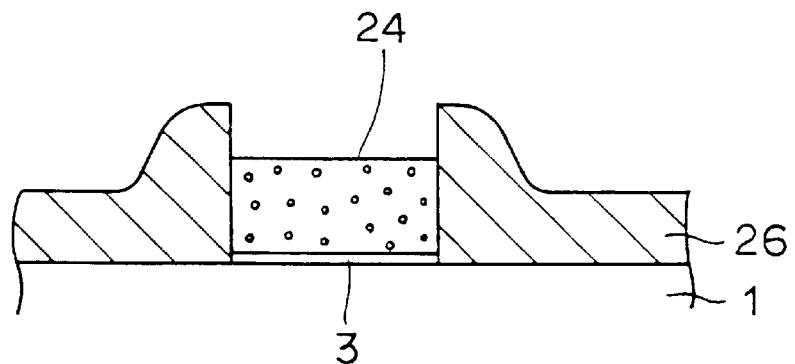
FIGS. 21 through 23 are cross-sectional views showing the first to third steps of manufacturing when the gate electrode is formed of doped polycrystalline silicon in the semiconductor device according to the second embodiment shown in FIG. 14.
Figure 22:
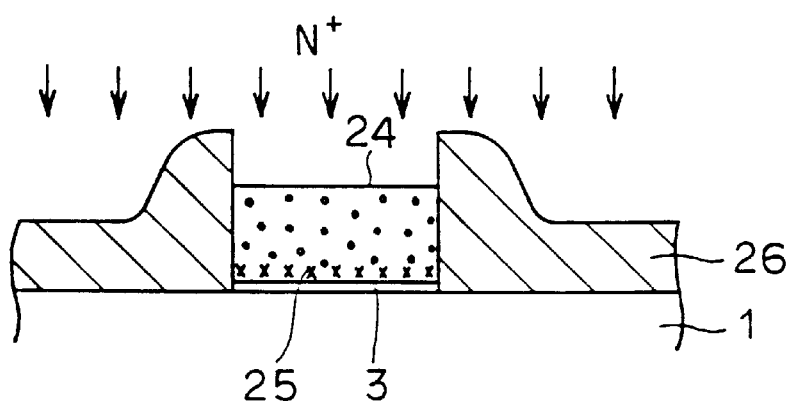
Figure 23:
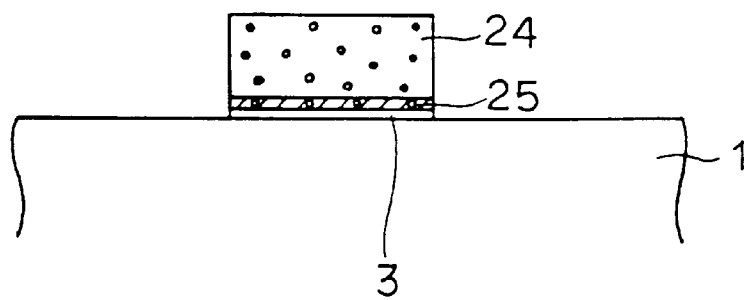

FIGS. 21–23 are cross-sectional views showing a manufacturing process when a gate electrode of the semiconductor device according to the second embodiment described above is formed of a doped polycrystalline silicon film. Referring to FIGS. 21–23, a manufacturing process when doped polycrystalline silicon is used as a gate electrode will be described.

As shown in FIG. 21, a gate oxide film 3 formed of a silicon oxide film and a gate electrode 24 formed of a doped polycrystalline silicon are formed at a predetermined region on the main surface of a silicon substrate 1. A resist 26 is formed to cover portions except for gate electrode 24.

As shown in FIG. 22, nitrogen is ion-implanted into gate electrode 24 using resist 26 as a mask. The nitrogen implantation is carried out under conditions, for example, of impurity concentration of 1E15–1E16/cm$^2$ and implantation energy (90 KeV) with which nitrogen is implanted near gate oxide film 3. Thus, nitrogen implanted region 25 is formed. Then resist 26 is removed. After that, heat treatment by furnace-annealing at a temperature in the range of about 800 to 1000° C. is carried out to activate impurity doped in gate electrode 24. By the heat treatment, the impurity in gate electrode 24 diffuses toward gate oxide film 3 while nitrogen in nitrogen implanted region 25 diffuses toward the opposite direction to gate oxide film 3. Thus, the impurity and nitrogen interdiffuse, which suppresses impurity diffusion into gate oxide film 3. As a result, the impurity in gate electrode 24 are prevented from passing through gate oxide film 3 to diffuse into the channel region. Thus, change of threshold voltage caused by impurity diffusion into the channel region can be prevented even when a doped polycrystalline silicon film is used as a gate electrode 24. Note that nitrogen implanted region 25 includes some impurity as shown in FIG. 23 after the heat treatment described above.

Figure 24:
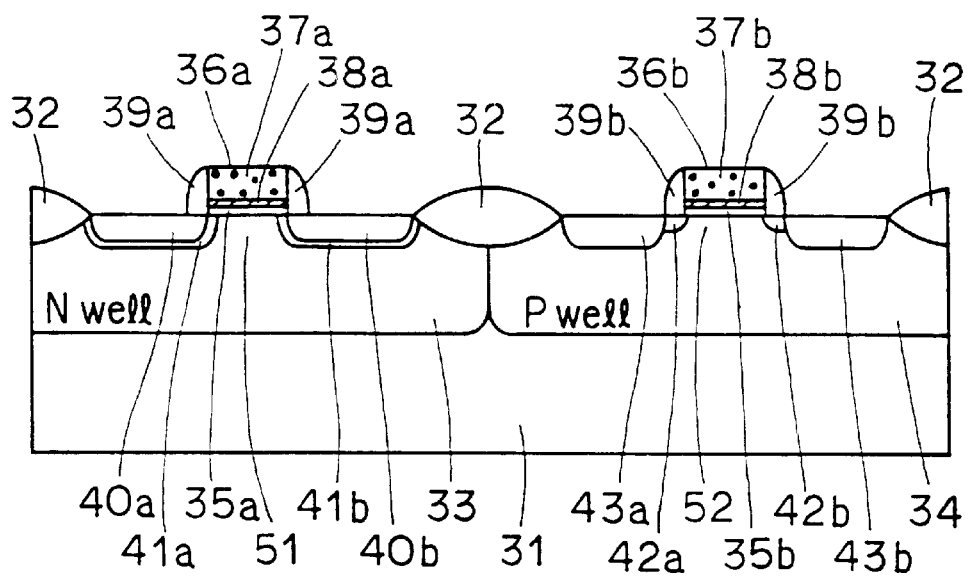
FIG. 24 is a cross-sectional view showing a semiconductor device including a CMOS transistor according to a third embodiment of the present invention.

FIG. 24 is a cross-sectional view showing a semiconductor device including a CMOS transistor according to the third embodiment of the present invention. Referring to FIG. 24, in the third embodiment, an isolation oxide film 32 is formed at a predetermined region on the main surface of silicon substrate 31. An N well 33 and a P well 34 are formed adjacent to each other on the main surface of the silicon substrate 31.

Source/drain regions 40a and 40b are formed with a predetermined distance therebetween to sandwich a channel region 51 on the main surface of N well 33. Nitrogen implanted regions 41a and 41b are formed to cover source/drain regions 40a and 40b, respectively. A gate electrode 36a is formed on channel region 51 with a gate oxide film 35a posed therebetween. A nitrogen implanted region 38a is formed on the side of gate oxide film 35a in gate electrode 36a. A boron implanted region 37a is formed on nitrogen implanted region 38a. A sidewall oxide film 39a is formed at the sidewall portion of gate electrode 36a.

On the main surface of P well 34, n$^+$ source/drain regions 43a and 43b are formed with a predetermined distance therebetween to sandwich a channel region 52, and n$^-$ source/drain regions 42a and 42b are formed at the side of channel region 52 of n$^+$ source/drain regions 43a and 43b. A gate electrode 36b is formed on channel region 52 with a gate oxide film 35b posed therebetween. A nitrogen implanted region 38 is formed at the side of gate oxide film 35b in gate electrode 36b, and a boron implanted region 37b is formed on nitrogen implanted region 38b. A sidewall oxide film 39b is formed at both sidewall portions of gate electrode 36b.

A P channel MOS transistor is formed of source/drain regions 40a and 40b in N well 33 and gate electrode 36a. An N channel MOS transistor which has an LDD (Lightly Doped Drain) structure is formed of n$^+$ source/drain regions 43a and 43b, n$^-$ source/drain regions 42a and 42b in P well 34 and gate electrode 36b.

In the third embodiment, nitrogen implanted regions 41a and 41b are formed to respectively cover source/drain regions 40a and 40b forming a P channel MOS transistor. By the nitrogen implanted regions 41a and 41b, inward diffusion of impurity in source/drain regions 40a and 40b to N well 33 caused by the heat treatment in forming source/drain regions 40a and 40b can be effectively prevented. Thus, diffusion of impurities in source/drain regions 40a and 40b toward the side of channel region 51 is also suppressed, which prevents reduction of the channel length. As a result, punch through phenomenon can be prevented effectively. This is especially effective in a case where an element is miniaturized.

Note that a nitrogen implanted region is not provided to cover n$^+$ source/drain regions 43a and 43b forming an N channel MOS transistor because diffusion of n type impurity caused by the heat treatment is smaller in amount than that of p type impurity. This is disclosed in, for example, IEEE *TRANSACTION ON ELECTRON DEVICES*, Vol. 35. No. 5, 1988 pp. 659–668.

In the third embodiment, nitrogen implanted regions 38a and 38b are formed in the region at the side of gate oxide films 35a and 35b of gate electrode 36a forming a P channel MOS transistor and gate electrode 36b forming an N channel MOS transistor. Boron implanted regions 37a and 37b are formed respectively on nitrogen implanted regions 38a and 38b. By the nitrogen implanted regions 38a and 38b, boron is prevented from passing through gate oxide films 35a and 35b to diffuse into channel regions 51 and 52 when heat treatment is carried out to activate boron in boron implanted regions 37a and 37b. Thus, change of threshold voltage caused by boron diffusion into channel regions 51 and 52 can be prevented. As a result, degradation of CMOS transistor characteristics can be effectively prevented.

FIGS. 25–34 are cross-sectional views showing a process for manufacturing a semiconductor device according to the third embodiment shown in FIG. 24. Referring to FIGS. 24–34, the third embodiment of the semiconductor device will be described.

Figure 25:
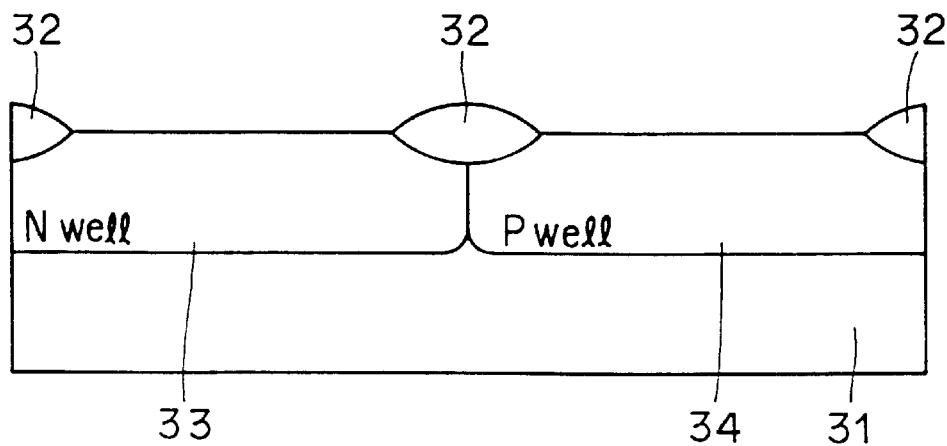
FIGS. 25 through 34 are cross-sectional views showing the first to tenth steps of manufacturing the semiconductor device of the third embodiment shown in FIG. 24.

As shown in FIG. 25, an N well 33 and a P well 34 are formed adjacent to each other on the main surface of a silicon substrate 31. An isolation oxide film 32 is formed in a predetermined region on the main surface of silicon substrate 31 by using LOCOS method.

Figure 26:
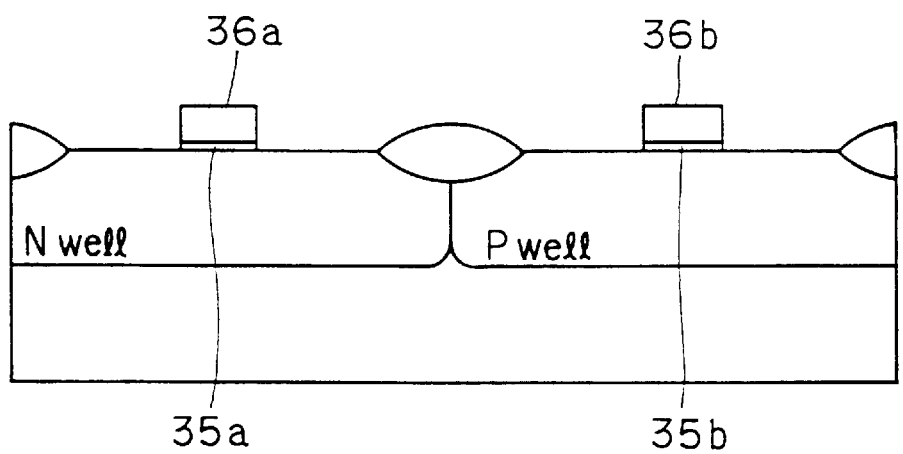

As shown in FIG. 26, a silicon oxide film (not shown) and a non-doped polycrystalline silicon film (not shown) having the thickness of about 2000 Å are formed and patterned, so that gate oxide films 35a and 35b of the silicon oxide film and gate electrodes 36a and 36b of the non-doped polycrystalline silicon film are formed.

Figure 27:
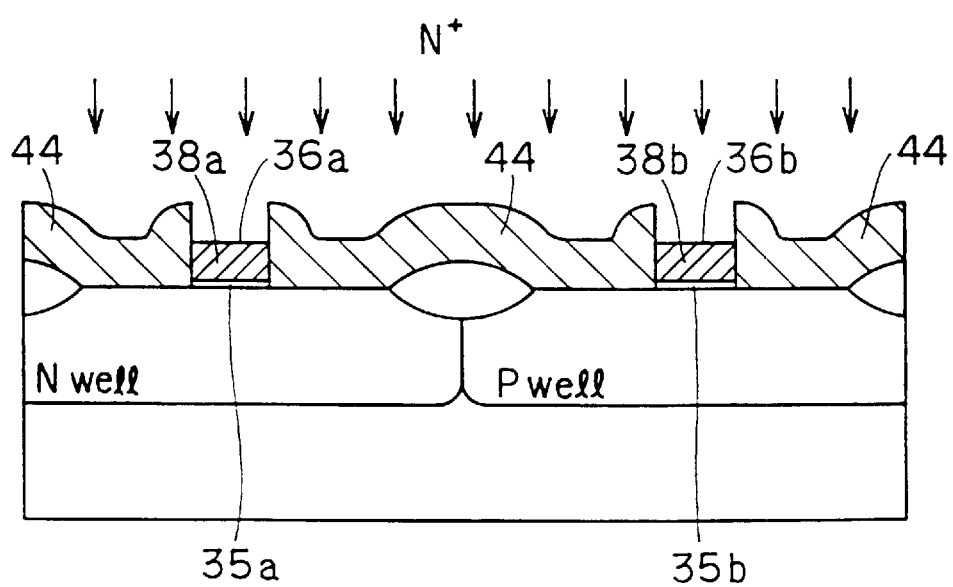

As shown in FIG. 27, a resist 44 is formed to cover portions except for gate electrodes 36a and 36b by photolithography. Nitrogen is ion-implanted into gate electrodes 36a and 36b using resist 44 as a mask. The nitrogen implantation is carried out under the following conditions. That is, at concentration of $1E15$–$1E16/cm^2$ and implantation energy (e.g. 90 KeV) with which nitrogen ions are implanted near gate oxide films 35a and 35b. Thus, nitrogen implanted regions 38a and 38b are formed.

Figure 28:
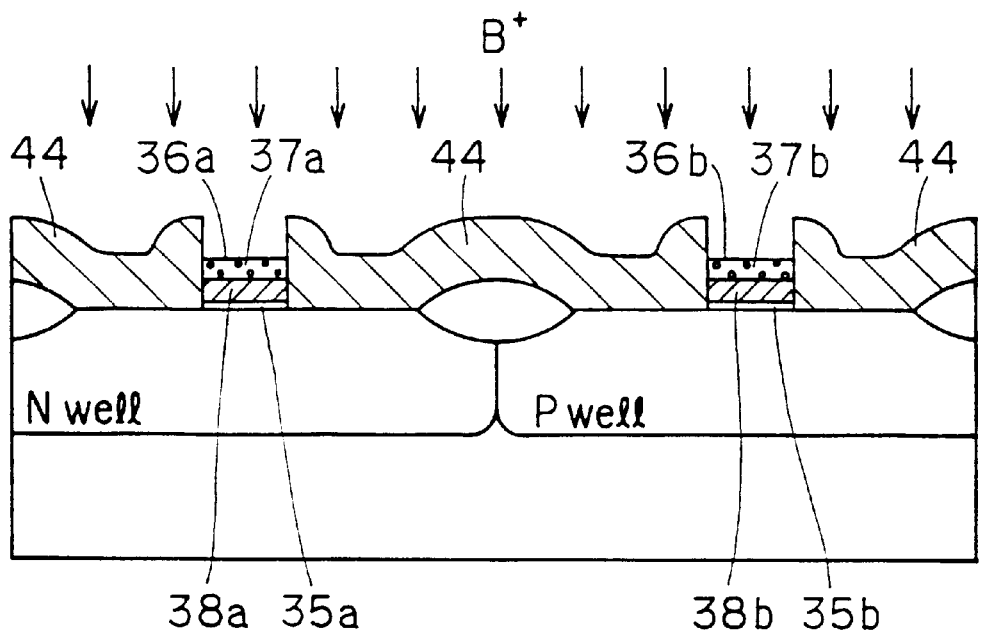

As shown in FIG. 28, boron is implanted into gate electrodes 36a and 36b using resist 44 as a mask. This boron implantation is carried out under the following conditions: impurity concentration is $5E15/cm^2$ and implantation energy is low enough (e.g. 30 KeV) to have the depth thereof smaller than that of nitrogen implanted regions 38a and 38b. Thus, boron implanted regions 37a and 37b are formed. After that resist 44 is removed. Heat treatment such as furnace-annealing at a temperature of about 800 to about 1000° C. is carried out. By this heat treatment, boron in boron implanted regions 37a and 37b diffuses toward gate oxide films 35a and 35b and nitrogen in nitrogen implanted regions 38a and 38b diffuses toward the opposite direction to gate oxide films 35a and 35b.

Thus, boron and nitrogen interdiffuse, which prevents boron diffusion toward gate oxide films 35a and 35b. As a result, boron is prevented from passing through gate oxide films 35a and 35b to diffuse into the channel region caused by the heat treatment to activate boron. Thus, change of the threshold voltage can be prevented.

Figure 29:
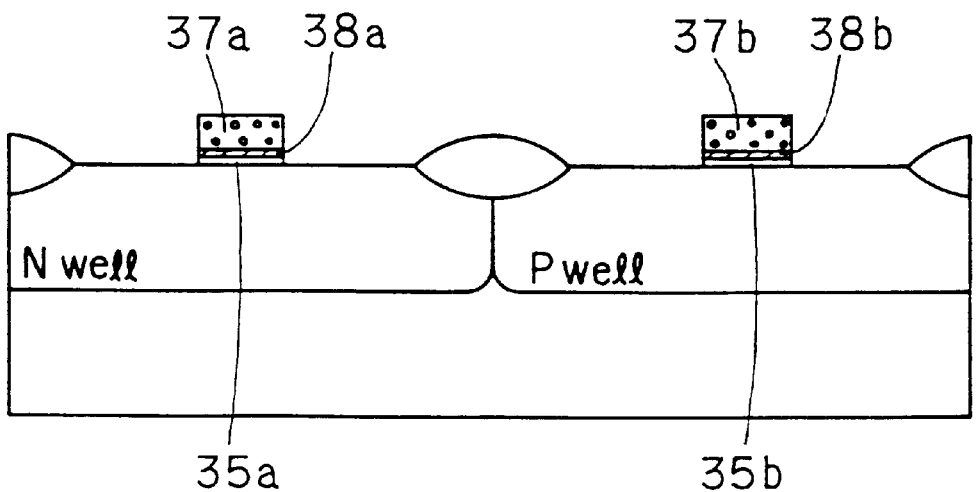

By the interdiffusion of boron and nitrogen described above, nitrogen implanted regions 38a and 38b and boron implanted regions 37a and 37b are formed at last as shown in FIG. 29.

Figure 30:
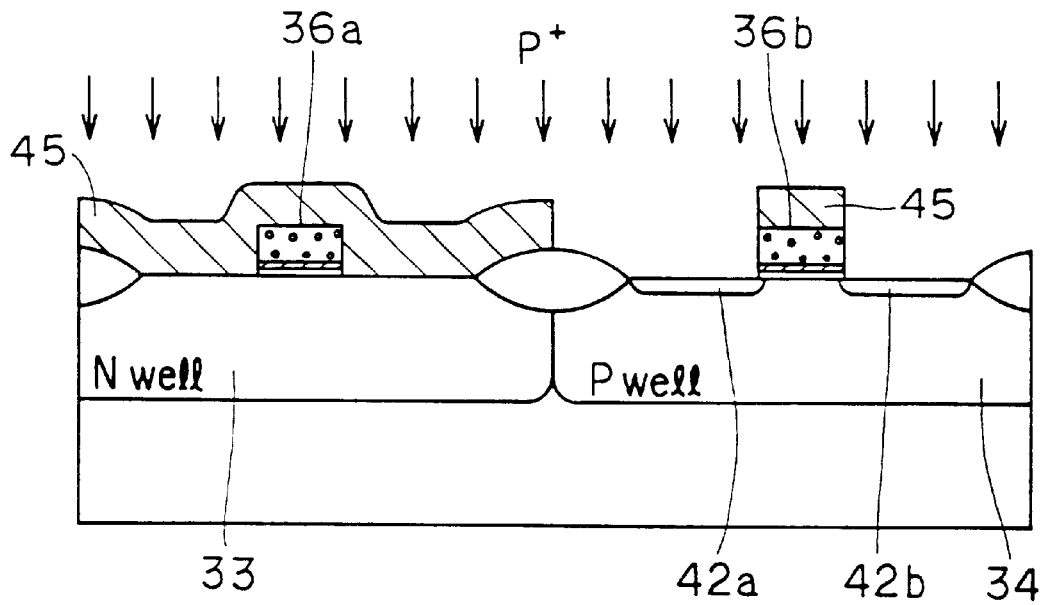

As shown in FIG. 30, a resist 45 is formed to cover an N well 33 and gate electrodes 36a and 36b by photolithography. Phosphorus (P) is ion-implanted into a P well 34 using resist 45 as a mask. Thus, n⁻ source/drain regions 42a and 42b of low impurity concentration are formed. After that, resist 45 is removed.

Figure 31:
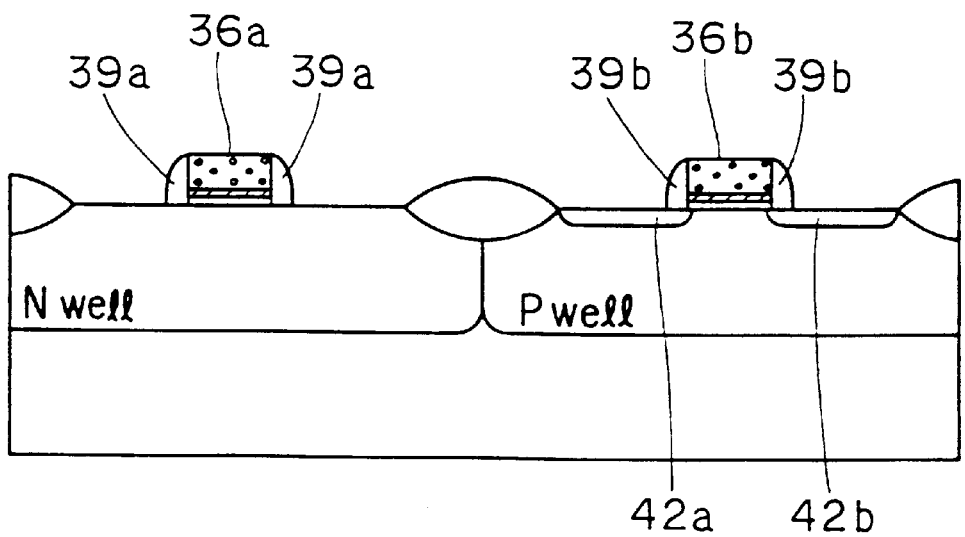

As shown in FIG. 31, after a silicon oxide film (not shown) is formed on the entire surface, sidewall oxide films 39a and 39b are formed at sidewall portions of gate electrodes 36a and 36b by anisotropic etching.

Figure 32:
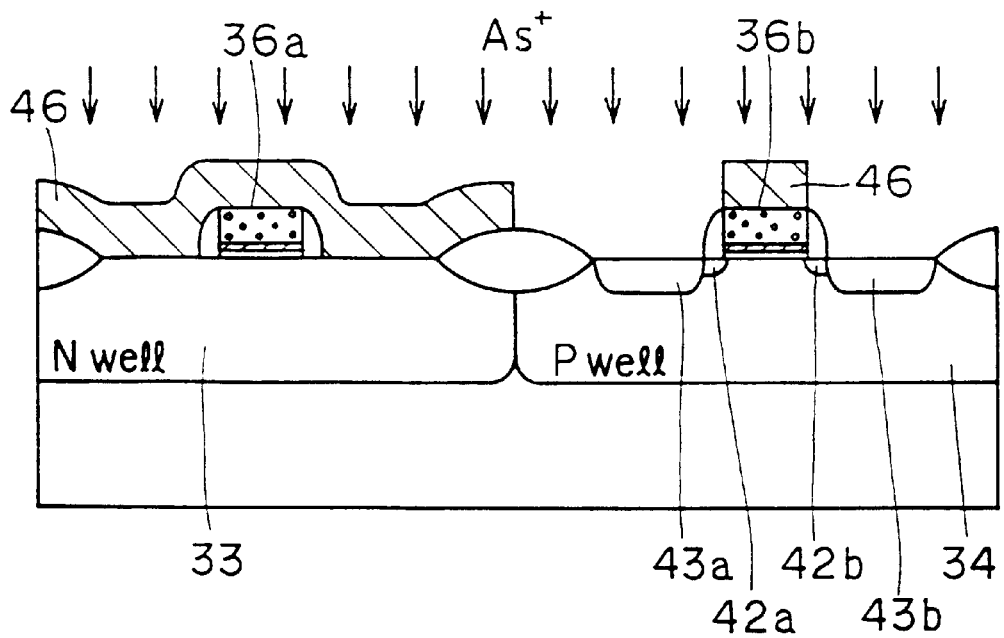

As shown in FIG. 32, a resist 46 is formed to cover N well 33 and gate electrodes 36a and 36b by using photolithography. Arsenic (As) is implanted to a high impurity concentration into P well 34 using resist 46 as a mask. Thus, n⁺ source/drain regions 43a and 43b are formed. After that resist 46 is removed.

Figure 33:
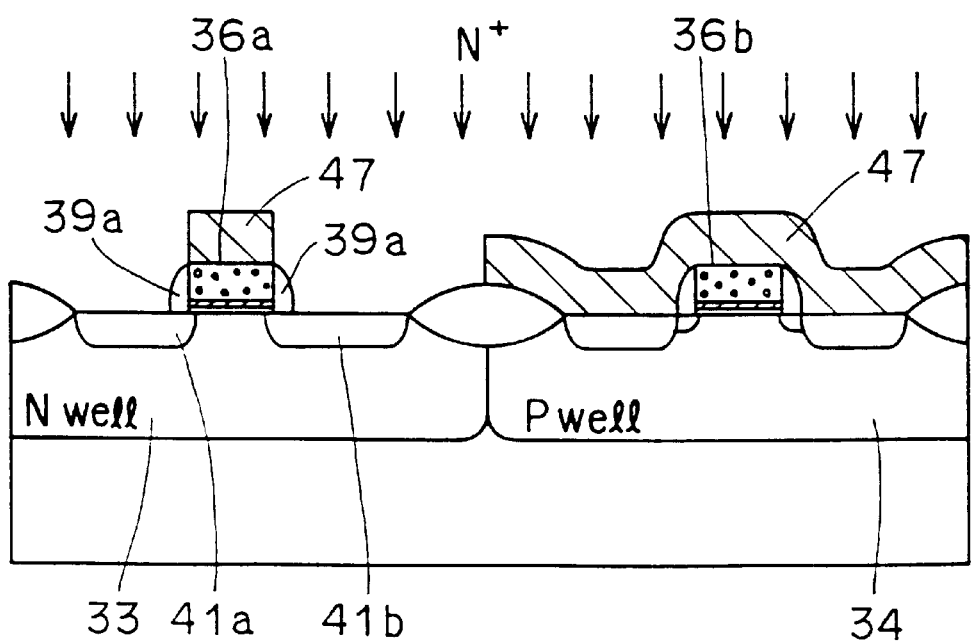

As shown in FIG. 33, a resist 47 is formed by using photolithography to cover P well 34 and gate electrodes 36a and 36b. Nitrogen is ion-implanted to a concentration of $1E15$–$1E16/cm^2$ using resist 47 and sidewall oxide film 39a as a mask. Implantation energy thereof is set to a value (0.065 μm at 30 KeV) larger than boron projected range (0.032 μm at 10 KeV) which will be implanted subsequently. By ion-implanting nitrogen in this manner, nitrogen implanted regions 41a and 41b are formed.

Figure 34:
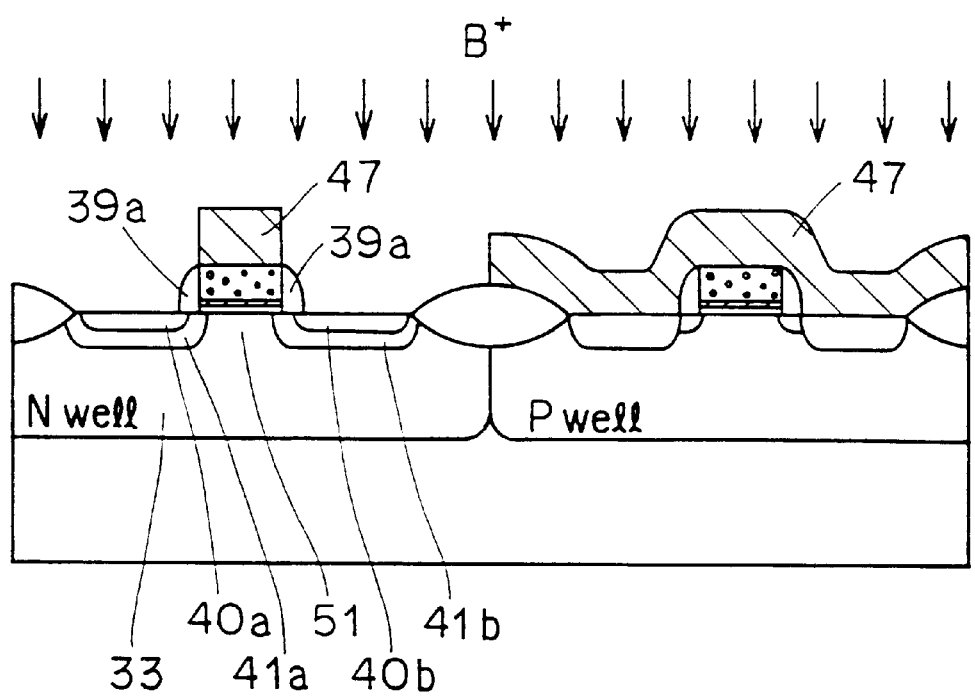

As shown in FIG. 34, boron is ion-implanted into N well 33 using resist 47 and sidewall oxide film 39a as a mask. The ion-implantation of boron is carried out at an impurity concentration of $5E15/cm^2$ and at an implantation energy of 0.032 μm at 10 KeV. Thus, boron implanted regions 40a and 40b are formed which are smaller in depth than ion-implanted regions 41a and 41b. More specifically, boron implanted regions 40a and 40b are surrounded by nitrogen implanted regions 41a and 41b, respectively.

After that, resist 47 is removed. Then, heat treatment at a temperature of 800° C. is carried out for thirty minutes in nitrogen atmosphere by furnace-annealing to electrically activate boron. By this heat treatment, boron in boron implanted regions 40a and 40b diffuses inwardly to N well 33, while nitrogen in nitrogen implanted regions 41a and 41b diffuses toward the surface of N well 33.

By this interdiffusion of boron and nitrogen, boron is prevented from diffusing into N well 33. As a result, diffusion of boron implanted regions 40a and 40b towards channel region 51 is prevented. Thus, reduction of the channel length can be effectively prevented, resulting in the reduction of punch through phenomenon. By this interdiffusion of boron and nitrogen, finally, source/drain regions 40a and 40b in which diffusion is suppressed is formed as shown in FIG. 24.

Note that ion-implantation of boron is carried out after nitrogen ion-implantation in a process for manufacturing a semiconductor device according to the first to third embodiments above: however, similar effect is obtained when boron ion-implantation is carried out before nitrogen ion-implantation. In the process for manufacturing the semiconductor device according to the first to third embodiments, furnace-annealing is used as a heat treatment for activating the impurity. However, similar effect will be obtained by using rapid thermal annealing (RPA). Additionally, in the semiconductor device according to the first to third embodiments described above, boron is used as a P type impurity included in source/drain regions: however, boron compound such as $BF_3$, $BF_2$, BF and BCl may be used.

Additionally, in the first to third embodiments described above, nitrogen is used for preventing diffusion of boron, similar effect will be obtained by using a material such as fluorine, argon, oxygen, carbon or the like.

Figure 35:
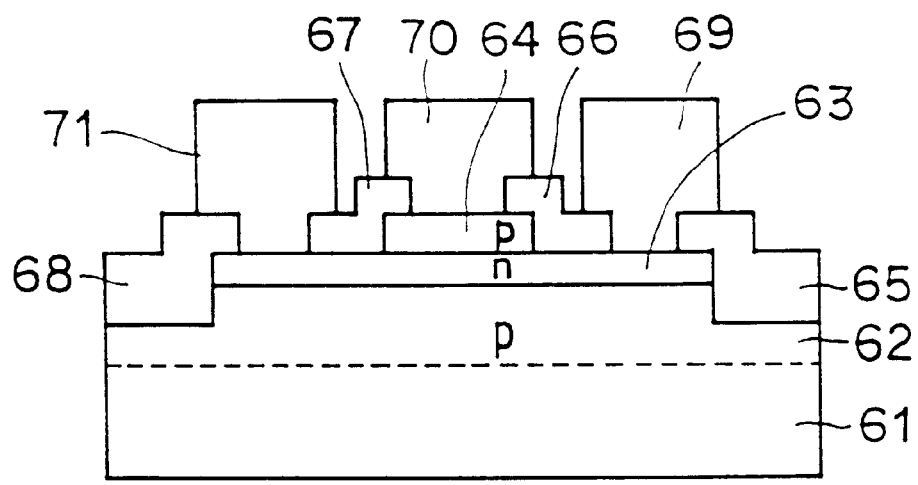
FIG. 35 is a cross section showing a pnp type bipolar transistor in accordance with a fourth embodiment of the present invention.

FIG. 35 is a cross section showing a semiconductor device (pnp type bipolar transistor) in accordance with a fourth embodiment of the present invention. Referring to FIG. 35, in the bipolar transistor in accordance with the fourth embodiment, a p type silicon collector 62 is formed at the main surface of-a p type silicon substrate 61. At prescribed regions on the main surface of p type silicon collector 62, $SiO_2$ films 65 and 68 are formed. On the p type silicon collector 62 in the region surrounded by $SiO_2$ films 65 and 68, an n type silicon base 63 is formed. At a prescribed region of n type silicon base 63, p⁺ type silicon epitaxial layer emitter 64 is formed.

$SiO_2$ films 66 and 67 are formed to cover side surface portions and a portion of upper surface of p⁺ type silicon epitaxial layer emitter 64. At prescribed regions of n type silicon base 63, base electrodes 69 and 71 are formed to be electrically connected to n type silicon base 63. At a prescribed region on the upper surface of p⁺ type silicon epitaxial layer emitter, an emitter electrode 70 is formed to be electrically connected to p⁺ type silicon epitaxial layer emitter 64.

Now, in the pnp type bipolar transistor in accordance with the fourth embodiment, in the boron doped p⁺ type silicon epitaxial layer emitter 64, about $1 \times 10^{19}/cm^3$ of nitrogen (N⁺) is contained. Accordingly, the disadvantage that by the heat treatment in activating impurities, boron is thermally diffused from p⁺ type silicon epitaxial layer emitter 64 to n type silicon base 63, piercing through thin n type silicon base, can be prevented. In other words, nitrogen serves to suppress diffusion of boron. As to the content of nitrogen, the aforementioned effect is apparent when the content is at least $1 \times 10^{19}/cm^3$. However, the effect of suppressing diffusion of boron can be obtained to some extent, even if the content is smaller than that.

As to the method of manufacturing the pnp transistor in accordance with the fourth embodiment above, p type silicon collector 62 and n type silicon base 63 may be formed by ion implantation or epitaxial growth. Antimony (Sb) or Arsenic (As) is used as n type impurity, and boron is used as the p type impurity. The $p^+$ silicon epitaxial layer emitter 64 is formed by epitaxial growth, and during the epitaxial growth, it is doped both with boron and nitrogen.

Figure 36:
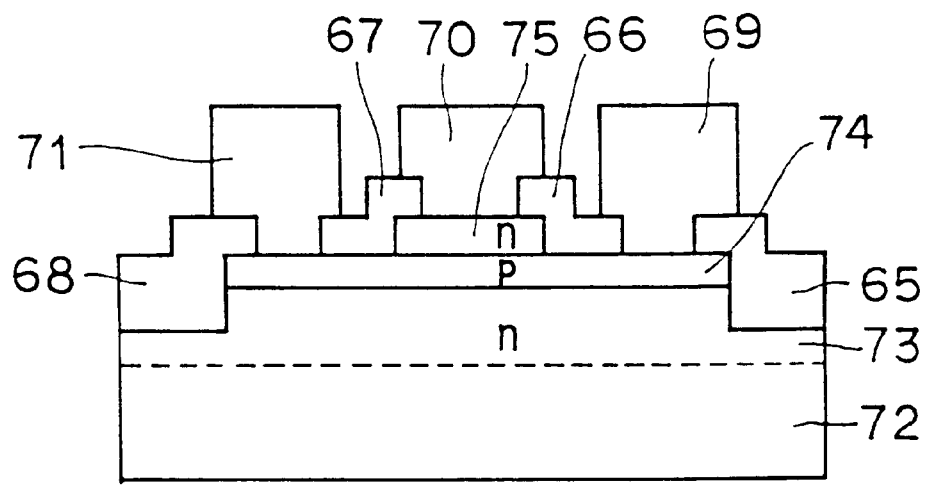
FIG. 36 is a cross section showing an npn type bipolar transistor in accordance with a fifth embodiment of the present invention.

FIG. 36 is a cross section showing an npn bipolar transistor in accordance with the fifth embodiment of the present invention. Referring to FIG. 36, the fifth embodiment is an application to an npn type bipolar transistor which can operate at high speed. In this fifth embodiment, an n type silicon collector 73 is formed at the main surface of n type silicon substrate 72. At prescribed regions on the main surface of n type silicon collector 73, $SiO_2$ films 65 and 68 are formed. At the main surface of n type silicon collector 73 surrounded by $SiO_2$ films 65 and 68, a p type SiGe epitaxial layer base 74 is formed. At a prescribed region of the main surface of p type SiGe epitaxial layer base 74, an n type epitaxial layer emitter 75 is formed. $SiO_2$ films 66 and 67 are formed to cover side surfaces and portions of upper surface of n type epitaxial layer emitter 75. On the upper surface of n type epitaxial layer emitter 75, an emitter electrode 70 is formed to be electrically connected thereto. At a prescribed region on p type SiGe epitaxial layer base 74, base electrodes 69 and 71 are formed to be electrically connected.

In the npn type hetero bipolar transistor in accordance with the fifth embodiment, boron as well as nitrogen ($N^+$) are doped in p type SiGe epitaxial layer base 74. The nitrogen effectively prevents thermal diffusion of boron. Thus, the disadvantage that boron diffuses from p type SiGe epitaxial layer base 74, widening effective base width, causing degradation of speed of operation and cut-off frequency can be effectively prevented.

In the fourth and fifth embodiments above, the present invention is applied to a bipolar transistor. However, the method of manufacturing of the present invention in which boron and nitrogen are simultaneously doped during epitaxial growth to prevent boron can be applied to any silicon base devices that includes the step of epitaxial growth.

Though the fourth and fifth embodiments above are applications to an epitaxial growth layer (mono crystalline layer), similar effects are expected in a polysilicon layer or an amorphous silicon layer. More specifically, when a polysilicon layer doped with boron or amorphous silicon layer doped with boron is formed, diffusion of boron can be effectively suppressed by simultaneously doping the layer with nitrogen.

A sixth embodiment of the present invention will be described. Different from the method of manufacturing in accordance with the first to fifth embodiments described above, in this sixth embodiment, not simple ions ($N^+$) of nitrogen but molecular ions ($N_2^+$) of nitrogen are used in nitrogen ion implantation. Molecular ion ($N_2^+$) of nitrogen has twice the number of nitrogen atoms and twice the mass number of simple ion ($N^+$). Therefore, when ion implantation is performed with the same amount of charges and same number of nitrogen atoms, crystal property in the ion implantation region is more readily disturbed when nitrogen molecular ions ($N_2^+$) are introduced, than when simple ions ($N^+$) of nitrogen are introduced. Therefore, when molecular ions of nitrogen ($N_2^+$) are used, channeling at the time of P type impurity ion implantation can be suppressed and diffusion of the p type impurity at the time of heat treatment can be suppressed, as compared with the case when simple ions of nitrogen ($N^+$) are used.

Figure 37:
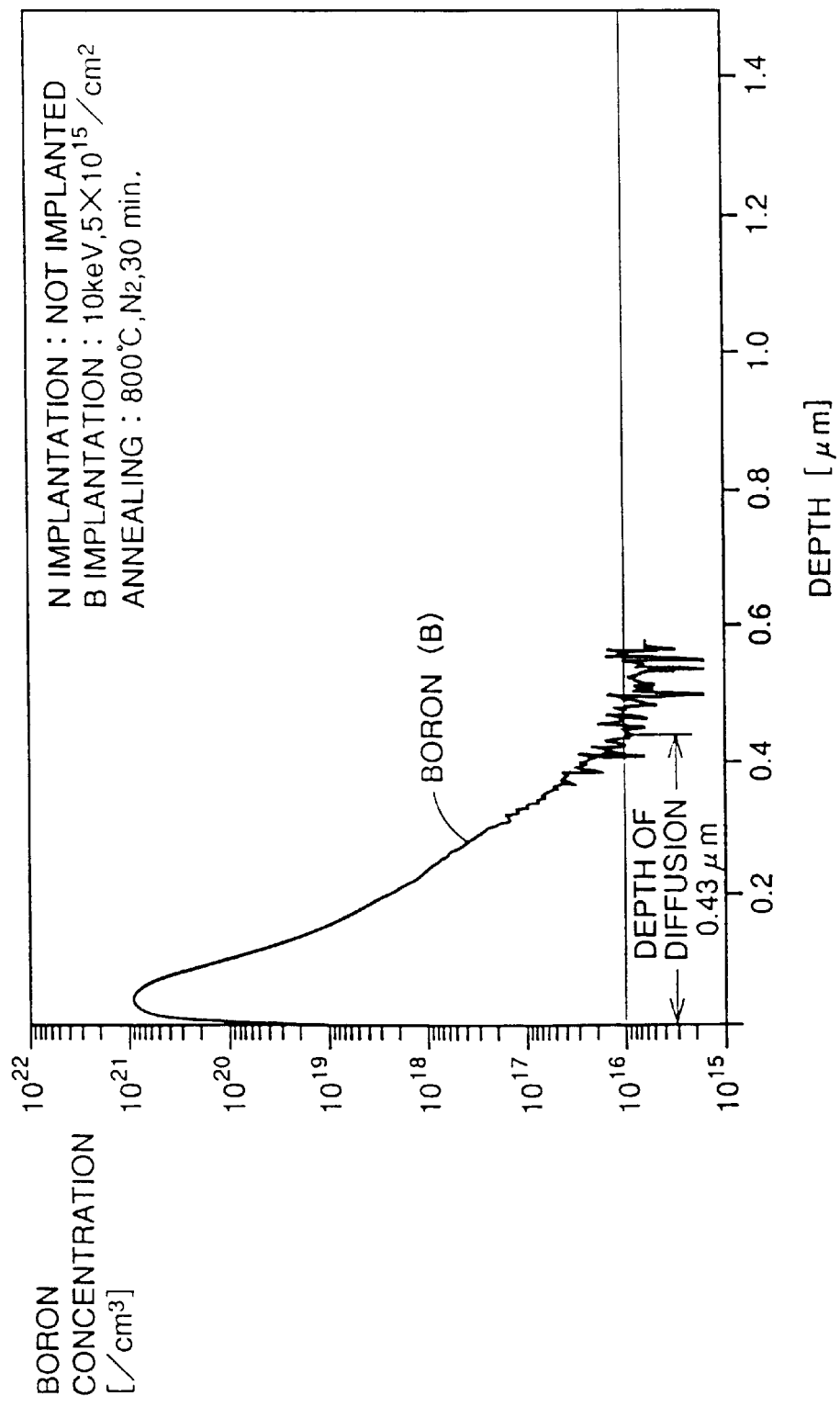
FIG. 37 is an impurity profile showing the state of diffusion of boron (B) when nitrogen ions are not introduced.
Figure 38:
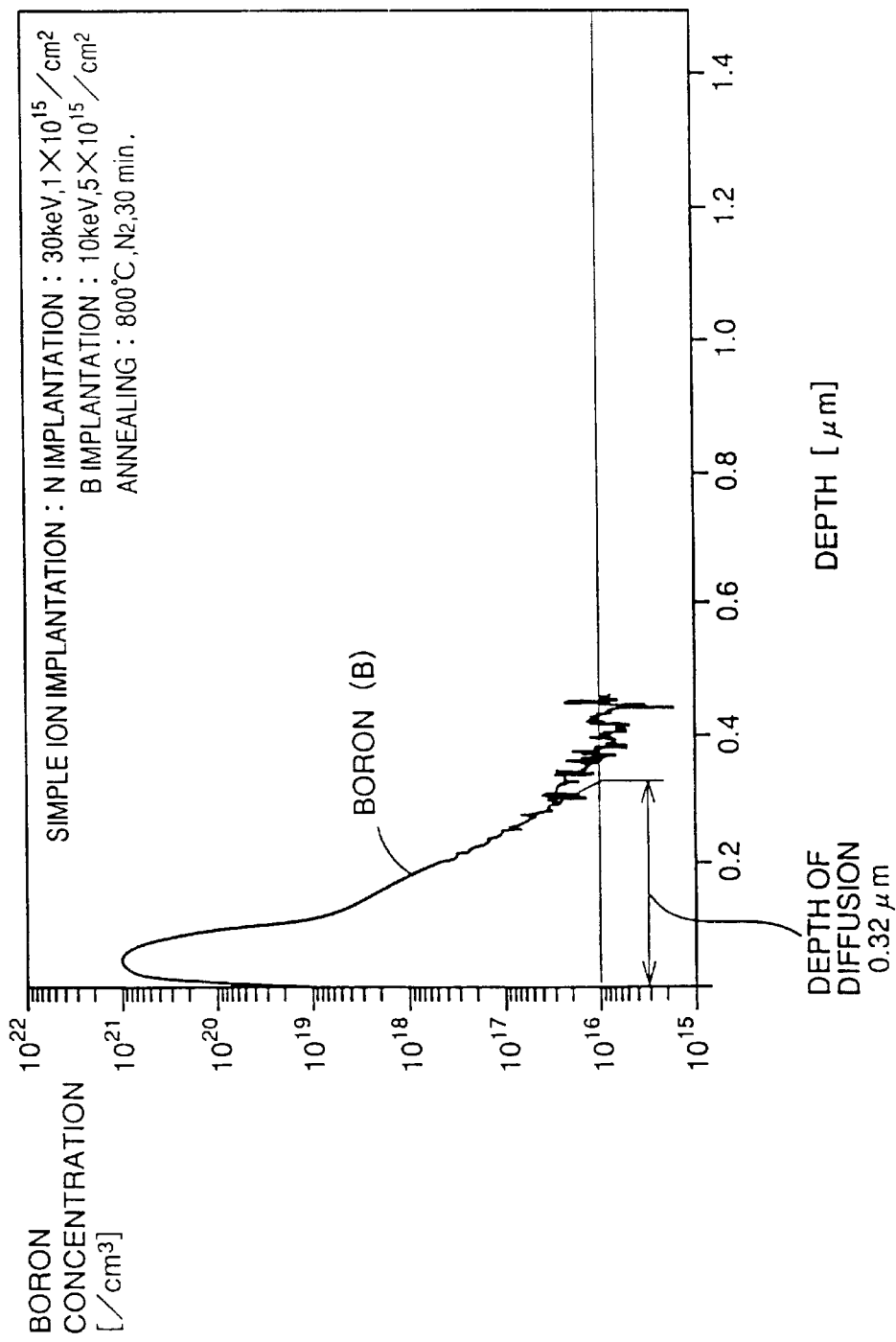
FIG. 38 is an impurity profile showing the state of diffusion of boron (B) when simple ions (N$^+$) of nitrogen are introduced.
Figure 39:
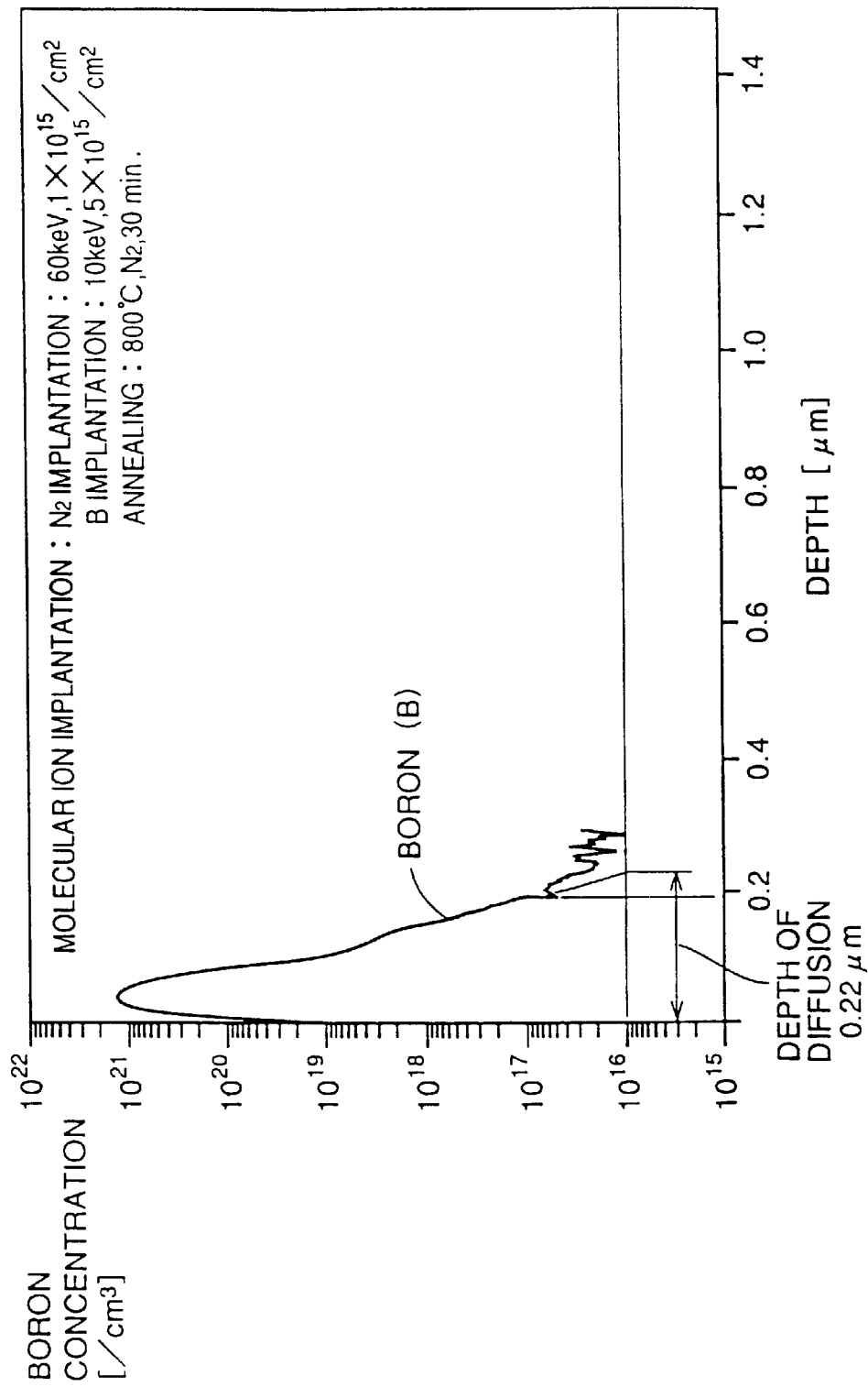
FIG. 39 is an impurity profile showing the state of diffusion of boron (B) when molecular ions (N$_2^+$) of nitrogen are introduced.
Figure 40:
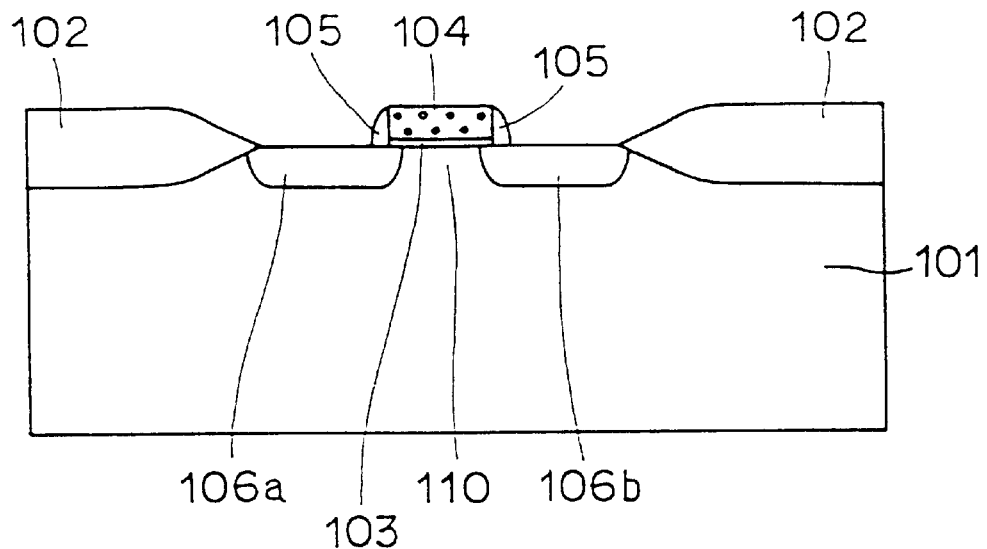
FIG. 40 is a cross-sectional view showing a conventional semiconductor device including a PMOS transistor.

FIG. 37 is an impurity profile showing the state of diffusion of boron (B) when nitrogen ion implantation is not performed, FIG. 38 is an impurity profile showing the state of diffusion of boron (B) when simple ions ($N^+$) of nitrogen are implanted, and FIG. 39 is an impurity profile showing the state of diffusion of boron (B) when molecular ions ($N_2^+$) of nitrogen are introduced. Ion implantation of boron (B) in the examples of FIGS. 37 to 39 was performed with the implantation energy of 10 keV and dosage of $5 \times 10^{15}/cm^2$ to silicon substrate. Heat treatment was performed in nitrogen atmosphere at 800° C. for about 30 minutes. Referring to FIG. 38, simple ions ($N^+$) of nitrogen were implanted with the energy of 30 keV to the silicon substrate with the ion dosage of $1 \times 10^{15}/cm^2$. Referring to FIG. 39, molecular ions ($N_2^+$) of nitrogen were implanted with the implantation energy of 60 keV to the silicon substrate and with ion dosage of $1 \times 10^{15}/cm^2$.

Referring to FIGS. 37 to 39, it can be seen that when nitrogen ions ($N^+$, $N_2^+$) are implanted, depth of diffusion of boron (B) is shallower than that when nitrogen ions are not introduced. Further, referring to FIGS. 38 and 39, depth of diffusion is made shallower when molecular ions ($N_2^+$) of nitrogen are implanted, than when simple ions ($N^+$) of nitrogen are implanted. Namely, diffusion of boron (B) can be more effectively prevented by implanting molecular ions ($N_2^+$) of nitrogen, than simple ions ($N^+$) of nitrogen.

When ion implantation is performed using molecular ions ($N_2^+$) of nitrogen, variation in resistance values in the silicon wafer surface can be reduced as compared with the case when simple ions ($N^+$) of nitrogen are used. In other wards, by using molecular ions ($N_2^+$) of nitrogen, uniformity of the resistance values in the silicon wafer surface can be improved than when simple ions ($N^+$) of nitrogen are used. The inventor actually experimented and obtained the following results. More specifically, to one silicon wafer, simple ions ($N^+$) of nitrogen were implanted under the same condition as that of FIG. 38, while to another silicon wafer, molecular ions ($N_2^+$) of nitrogen were implanted under the same condition as that of FIG. 39. Uniformity of the resistance values of these two silicon wafers were measured, using the following equation.

Uniformity of Resistance Value=Standard Deviation of Resistance values/Average Resistance Value×100

By calculation in accordance with the above equation, it was found that uniformity of the resistance values when simple ions ($N^+$) of nitrogen were used was 12.997%, while it was 0.943% when molecular ions ($N_2^+$) of nitrogen were used. The smaller the value of uniformity of resistance values, the superior the uniformity of the resistance values. Therefore, it can be understood that uniformity of the resistance values of the silicon wafer can be remarkably improved when molecular ions ($N_2^+$) of nitrogen are used, than when simple ions ($N^+$) of nitrogen are used.

Accordingly, in a semiconductor device of the present invention, by forming an implantation layer having the depth equal to or greater than junction depth of source/drain regions along the entire junction region of source/drain regions, owning to the implanted layer, an impurity can be effectively prevented from diffusing inwardly to the semiconductor region when heat treatment is carried out for activating the impurity in source/drain regions. Thus, the impurity in source/drain regions can be prevented from diffusing toward the side of channel region caused by the heat treatment, which prevents the reduction of the channel length. As a result, punch through phenomenon can be effectively prevented. When the implanted region is formed to have a greater depth than the junction depth of source/drain regions and to cover source/drain regions, diffusion of impurity in source/drain regions can be effectively prevented.

In the semiconductor device in accordance with another aspect of the present invention, by forming an implantation layer near the surface at the side of a gate insulation film of a gate electrode including an impurity, the impurity in the gate electrode can be effectively prevented from diffusing toward the side of the gate insulation layer in heat treatment to activate the impurity in the gate electrode. Thus, the impurity in the gate electrode can be prevented from passing through the gate insulation layer to diffuse into the channel region. As a result, change of the threshold voltage caused by the impurity diffusion into the channel region can be prevented.

According to one method of manufacturing the semiconductor device of the present invention, an implantation layer is formed by ion-implanting a material selected from the group consisting of nitrogen, fluorine, argon, oxygen and carbon into a semiconductor region of a first conductivity type with a first projected range, and a pair of impurity regions of a second conductivity type are formed by ion-implanting impurity of a second conductivity type into the same semiconductor region with a second projected range which is smaller than the first projected range, such that the impurity regions are surrounded by the implantation layer. Thus, when heat treatment is carried out after that, impurity in impurity region diffuses inwardly to the semiconductor region while nitrogen in the implanted region diffuses toward the surface of the semiconductor region. As a result, impurity and nitrogen interdiffuse, which suppresses the diffusion of the impurity into the semiconductor region. Thus, the diffusion of the impurity to the side of the channel region can be suppressed, which prevents the reduction of the channel length. As a result, manufacturing of the semiconductor device which can prevent punch through phenomenon can be facilitated effectively.

According to another method of manufacturing the semiconductor device of the present invention, an impurity region is formed in a gate electrode by introducing impurity into the gate electrode, and an implantation layer having the depth equal to or greater than that of the impurity region is formed by ion-implanting a material selected from the group consisting of nitrogen, fluorine, argon, oxygen and carbon into the gate electrode, so that when heat treatment is carried out after that, the impurity in the impurity region diffuses towards a gate insulation layer while nitrogen in the implantation layer diffuses toward the opposite direction to the gate insulation layer. Thus, impurity and nitrogen interdiffuse, which suppresses diffusion of the impurities to the side of the gate insulation layer. As a result, impurity can be effectively prevented from passing through the gate insulation layer to diffuse into the channel region. Thus, manufacturing of the semiconductor device which can prevent the change of threshold voltage can be facilitated.

In the method of manufacturing described above, when molecular ions ($N_2^+$) of nitrogen are used as nitrogen ions at the time of nitrogen ion implantation, diffusion of impurity can be further suppressed than when simple ions ($N^+$) of nitrogen are used.

In the bipolar transistor in accordance with a still further aspect of the present invention, as the p type epitaxial growth layer constituting the bipolar transistor is formed to contain boron as well as nitrogen, diffusion of boron can be effectively prevented by nitrogen, and as a result, degradation of cut-off frequency characteristic and speed of operation of the npn transistor, for example, can be effectively prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising sequentially:

forming a gate electrode in a predetermined region on a main surface of a semiconductor region of a first conductivity type with a gate insulation layer posed therebetween;

forming an implantation layer by ion-implanting molecular ions of nitrogen into said semiconductor region with a first implantation energy using said gate electrode as a mask;

forming a pair of impurity regions of a second conductivity type, after forming the implantation layer, by ion implanting an impurity of a second conductivity type into said semiconductor region with a second implantation energy which is smaller than the first implantation energy using said gate electrode as a mask; and carrying out heat treatment.

2. The method of manufacturing a semiconductor device according to claim 1, wherein said nitrogen ion-implantation is carried out with an implantation energy of 30 KeV and impurity concentration of 1E15–1E16/$cm^2$;

said impurity ion-implantation is carried out by using boron with an implantation energy of 10 KeV and impurity concentration of 5E15/$cm^2$; and said heat treatment is carried out at a temperature in the range of about 800° C. to 900° C. for thirty minutes in nitrogen atmosphere.

3. A method of manufacturing a semiconductor device, comprising the steps of:

forming a gate electrode in a predetermined region on a main surface of a semiconductor region of a first conductivity type with a gate insulation layer posed therebetween;

forming an impurity region having a predetermined depth from the upper surface of said gate electrode in said gate electrode by introducing an impurity into said gate electrode;

forming an implantation layer having a depth equal to or greater than that of said impurity region by ion-implanting molecular ions of nitrogen into said gate electrode; and carrying out heat treatment thereafter.

4. The method of manufacturing a semiconductor device according to claim 3, wherein said impurity is introduced by ion-implanting said impurity into said gate electrode.

5. The method of manufacturing a semiconductor device according to claim 3, wherein
said impurity is introduced concurrently with deposition of said gate electrode.

6. A method of manufacturing a semiconductor device, comprising:

forming a gate electrode in a predetermined region on a main surface of a semiconductor region of a first conductivity type with a gate insulation layer posed therebetween;

forming an impurity region having a predetermined depth from the upper surface of said gate electrode in said gate electrode by introducing an impurity into said gate electrode;

forming an implantation layer, after forming the impurity region, having a depth equal to or greater than that of said impurity region by ion-implanting molecular ions of nitrogen into said gate electrode; and carrying out heat treatment-thereafter.

* * * * *